United States Patent
Han et al.

(10) Patent No.: US 8,553,466 B2
(45) Date of Patent: *Oct. 8, 2013

(54) NON-VOLATILE MEMORY DEVICE, ERASING METHOD THEREOF, AND MEMORY SYSTEM INCLUDING THE SAME

(75) Inventors: Jinman Han, Seongnam-si (KR); Doogon Kim, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 184 days.

This patent is subject to a terminal disclaimer.

(21) Appl. No.: 13/023,934

(22) Filed: Feb. 9, 2011

(65) Prior Publication Data

US 2011/0216603 A1    Sep. 8, 2011

Related U.S. Application Data

(60) Provisional application No. 61/356,672, filed on Jun. 21, 2010.

(30) Foreign Application Priority Data

Mar. 4, 2010    (KR) .................. 10-2010-0019532

(51) Int. Cl.
*G11C 11/34*    (2006.01)
(52) U.S. Cl.
USPC ............ 365/185.29; 365/185.27; 365/185.23; 365/185.18; 365/185.24
(58) Field of Classification Search
USPC ............ 365/185.29, 185.27, 185.23, 185.18, 365/185.24
See application file for complete search history.

(56) References Cited

U.S. PATENT DOCUMENTS

| 5,511,022 | A | * | 4/1996 | Yim et al. ................ 365/185.17 |
| 5,673,223 | A | | 9/1997 | Park | |
| 5,740,107 | A | * | 4/1998 | Lee ........................ 365/185.11 |
| 5,923,587 | A | * | 7/1999 | Choi ....................... 365/185.11 |
| 6,009,014 | A | * | 12/1999 | Hollmer et al. ......... 365/185.22 |
| 6,028,788 | A | * | 2/2000 | Choi et al. ............... 365/185.11 |
| 6,285,587 | B1 | * | 9/2001 | Kwon ...................... 365/185.11 |

(Continued)

FOREIGN PATENT DOCUMENTS

| JP | 9007383 A | 1/1997 |
| JP | 10-032269 A | 2/1998 |

(Continued)

OTHER PUBLICATIONS

Jaehoon Jang et al, "Vertical Cell Array using TCAT (Terabit Cell Array Transistor) Technology for Ultra High Density NAND Flash Memory", VLSI Symp. Tech. Dig., pp. 192-193, 2009.

(Continued)

*Primary Examiner* — Viet Q Nguyen
(74) *Attorney, Agent, or Firm* — Harness, Dickey & Pierce, P.L.C.

(57) ABSTRACT

Provided is an erasing method of a nonvolatile memory device. The erasing method applies a word line erase voltage to a plurality of word lines connected to the memory cells respectively, applies a specific voltage to a ground selection line connected to the ground selection transistor, applies an erase voltage to a substrate in which the memory string formed during the step applying the specific voltage to the ground selection line, and floats the ground selection line in response to a voltage change of the substrate.

37 Claims, 26 Drawing Sheets

(56) References Cited

U.S. PATENT DOCUMENTS

| | | | |
|---|---|---|---|
| 6,650,566 | B2 | 11/2003 | Jeong et al. |
| 6,975,542 | B2 | 12/2005 | Roohparvar |
| 7,064,986 | B2 | 6/2006 | Lee et al. |
| 7,079,419 | B2 | 7/2006 | Roohparvar |
| 7,177,192 | B2 * | 2/2007 | Yoon et al. ............... 365/185.17 |
| 7,292,476 | B2 | 11/2007 | Goda et al. |
| 7,403,422 | B2 | 7/2008 | Kim et al. |
| 7,403,429 | B2 * | 7/2008 | Chae et al. ............... 365/185.29 |
| 7,417,904 | B2 | 8/2008 | Sivero et al. |
| 7,450,433 | B2 | 11/2008 | Wan et al. |
| 7,489,556 | B2 | 2/2009 | Tanzawa |
| 7,518,920 | B2 | 4/2009 | Kang |
| 7,529,138 | B2 * | 5/2009 | Park et al. ............... 365/185.29 |
| 7,532,514 | B2 | 5/2009 | Cernea et al. |
| 7,551,492 | B2 * | 6/2009 | Kim ........................ 365/185.29 |
| 7,566,927 | B2 | 7/2009 | Kim et al. |
| 7,606,074 | B2 | 10/2009 | Wan et al. |
| 7,633,803 | B2 | 12/2009 | Lee |
| 7,668,014 | B2 | 2/2010 | Hwang |
| 7,724,577 | B2 | 5/2010 | Goda et al. |
| 7,778,084 | B2 | 8/2010 | Kim et al. |
| 7,859,902 | B2 | 12/2010 | Maejima |
| 7,888,731 | B2 * | 2/2011 | Kim ............................. 257/324 |
| 7,936,617 | B2 | 5/2011 | Sudo |
| 7,983,084 | B2 | 7/2011 | Tokiwa et al. |
| 8,013,389 | B2 | 9/2011 | Oh et al. |
| 8,023,321 | B2 | 9/2011 | Kim |
| 8,169,826 | B2 | 5/2012 | Hishida et al. |
| 8,228,733 | B2 | 7/2012 | Tokiwa et al. |
| 8,243,518 | B2 * | 8/2012 | Oh et al. ................. 365/185.18 |
| 2002/0071311 | A1 | 6/2002 | Jeong et al. |
| 2005/0006692 | A1 | 1/2005 | Kim et al. |
| 2005/0141283 | A1 | 6/2005 | Lee et al. |
| 2006/0140012 | A1 | 6/2006 | Wan et al. |
| 2007/0070701 | A1 | 3/2007 | Kim et al. |
| 2007/0158736 | A1 | 7/2007 | Arai et al. |
| 2007/0159886 | A1 | 7/2007 | Kang |
| 2007/0183204 | A1 | 8/2007 | Kim et al. |
| 2007/0252201 | A1 | 11/2007 | Kito et al. |
| 2007/0297234 | A1 | 12/2007 | Cernea et al. |
| 2008/0007999 | A1 | 1/2008 | Park et al. |
| 2008/0253183 | A1 | 10/2008 | Mizukami et al. |
| 2008/0279012 | A1 | 11/2008 | Lee |
| 2009/0002182 | A1 | 1/2009 | Knox et al. |
| 2009/0021983 | A1 | 1/2009 | Wan et al. |
| 2009/0021988 | A1 | 1/2009 | Hong et al. |
| 2009/0097309 | A1 | 4/2009 | Mizukami et al. |
| 2009/0122613 | A1 | 5/2009 | Kim et al. |
| 2009/0168533 | A1 | 7/2009 | Park et al. |
| 2009/0175081 | A1 | 7/2009 | Kim |
| 2009/0180323 | A1 | 7/2009 | Park et al. |
| 2009/0268524 | A1 | 10/2009 | Maejima |
| 2009/0279359 | A1 | 11/2009 | Goda et al. |
| 2010/0124120 | A1 | 5/2010 | Park et al. |
| 2010/0195395 | A1 | 8/2010 | Jeong et al. |
| 2010/0238732 | A1 | 9/2010 | Hishida et al. |
| 2011/0063913 | A1 | 3/2011 | Maejima |
| 2011/0199825 | A1 | 8/2011 | Han et al. |
| 2011/0238913 | A1 | 9/2011 | Kurashige et al. |
| 2012/0099377 | A1 | 4/2012 | Maejima |
| 2012/0275234 | A1 * | 11/2012 | Lee et al. ................. 365/185.23 |

FOREIGN PATENT DOCUMENTS

| | | |
|---|---|---|
| JP | 2002203393 A | 7/2002 |
| JP | 2005032430 A | 2/2005 |
| JP | 2005196931 A | 7/2005 |
| JP | 2007087569 A | 4/2007 |
| JP | 2007-180389 A | 7/2007 |
| JP | 2007-184090 A | 7/2007 |
| JP | 2007-200540 A | 8/2007 |
| JP | 2007272952 | 10/2007 |
| JP | 2007266143 | 11/2007 |
| JP | 2007-323716 A | 12/2007 |
| JP | 2008-311650 A | 12/2008 |
| JP | 2009-026369 | 2/2009 |
| JP | 2009-088446 | 4/2009 |
| JP | 2009124107 | 6/2009 |
| JP | 2009-266281 | 11/2009 |
| KR | 100157342 B1 | 7/1998 |
| KR | 100390145 | 6/2002 |
| KR | 100688494 A | 1/2005 |
| KR | 100541819 A | 7/2005 |
| KR | 1020060129806 A | 12/2006 |
| KR | 10-0672151 | 1/2007 |
| KR | 100706797 B1 | 4/2007 |
| KR | 100729359 B1 | 6/2007 |
| KR | 10-0784862 B1 | 7/2007 |
| KR | 2007-0078355 A | 7/2007 |
| KR | 10-2007-0096972 | 10/2007 |
| KR | 100897415 A | 11/2007 |
| KR | 10-2008-0005765 | 1/2008 |
| KR | 100890016 A | 11/2008 |
| KR | 2008-0110168 A | 12/2008 |
| KR | 2009-0002471 A | 1/2009 |
| KR | 100884861 | 2/2009 |
| KR | 10-2009-0034776 | 4/2009 |
| KR | 102009004887 | 5/2009 |
| KR | 10-2009-0072406 | 7/2009 |
| KR | 1020090079037 | 7/2009 |

OTHER PUBLICATIONS

Office Action dated Jan. 15, 2013 for related U.S. Appl. No. 13/028,918.

US Office Action dated Apr. 5, 2013 for related U.S. Appl. No. 13/029,518.

US Office Action dated Mar. 12, 2013 for related U.S. Appl. No. 12/985,695.

* cited by examiner

Fig. 7

| SSL | Float |
| WL | Vwe |
| GSL | Float |
| Substrate | Vers |

Fig. 10

| SSL | Float |
| --- | --- |
| WL | Vwe |
| GSL | Vss → Float |
| Substrate | Vers |

NON-VOLATILE MEMORY DEVICE, ERASING METHOD THEREOF, AND MEMORY SYSTEM INCLUDING THE SAME

CROSS-REFERENCE TO RELATED APPLICATIONS

This application claims priority under 35 U.S.C. §119 to Korean Patent Application No. 10-000019532 filed on Mar. 4, 2010 in the Korean Intellectual Property Office (KIPO) and U.S. Provisional Ser. No. 61/356,672, filed on Jun. 21, 2010, the entire contents of each of which are herein incorporated by reference.

BACKGROUND

The present disclosure herein relates to a semiconductor memory, and more particularly, to a nonvolatile memory device, an erasing method thereof, and a memory system including the same.

A semiconductor memory device is a memory device that is implemented with semiconductor materials such as silicon (Si), germanium (Ge), gallium arsenide (GaAs) and indium phosphide (InP). Semiconductor memory devices may be largely divided into a volatile memory device and a nonvolatile memory device.

The volatile memory device is a memory device in which data stored are erased when a power source is shut off. Examples of volatile memory devices include Static Random Access Memory (SRAM), Dynamic Random Access Memory (DRAM) and Synchronous Dynamic Random Access Memory (SDRAM). A nonvolatile memory device is a memory device that retains stored data even when a power source is shut off. Examples of nonvolatile memory devices include Read-Only Memory (ROM), Programmable Read Only Memory (PROM), Erasable Programmable Read Only Memory (EPROM), Electrical Erasable Programmable Read Only Memory (EEPROM), flash memory devices, Phase-change Random Access Memory (PRAM), Magnetoresistive Random Access Memory (MRAM), Resistive Random Access Memory (RRAM) and Ferroelectric Random Access Memory (FRAM). Flash memory devices may be largely categorized into a NOR type and a NAND type.

SUMMARY

The present disclosure provides a nonvolatile memory device for example, having a 3-dimensional array structure, an erasing method thereof, and a memory system including the same.

Embodiments of inventive concepts provide an erasing method of a nonvolatile memory device having a memory string including a plurality of memory cells, a string selection transistor, and a ground selection transistor, the erasing method comprising applying a word line erase voltage to a plurality of word lines connected to the memory cells respectively, applying a specific voltage to a ground selection line connected to the ground selection transistor, applying an erase voltage to a substrate in which the memory string formed during the step applying the specific voltage to the ground selection line, and floating the ground selection line in response to a voltage change of the substrate.

In example embodiments, the applying of a specific voltage comprises applying a ground voltage to the ground selection line.

In example embodiments, the floating of the ground selection line is performed when the voltage level of the substrate reaches a target voltage level.

In example embodiments, the memory cells are stacked in a direction vertical to the substrate.

Embodiments of inventive concepts provide a nonvolatile memory device comprising a memory cell array comprising a plurality of memory cell strings which are provided onto a substrate, a reading and writing circuit connected to the memory cell strings through a plurality of bit lines, and configured to drive the bit lines, an address decoder connected to the memory cell strings through a plurality of word lines, a string selection line and a ground selection line, and configured to drive the word lines and the selection lines, and a substrate monitor circuit monitoring a voltage level of the substrate wherein the address decoder drives the ground selection line according to a monitored result in an erasing operation.

In example embodiments, when an erasing voltage for the erase operation is started to be applied to the substrate, the address decoder is configured to drive the ground selection line to a ground voltage.

In example embodiments, during the erasing operation, the address decoder is configured to float the ground selection line when a voltage level of the substrate reaches a target voltage level.

In example embodiments, the substrate monitor circuit comprises first and second trimmers connected between a ground node and a substrate node to which a voltage of the substrate is provided and a comparator configured to compare a target voltage and a voltage of a node between the first and second trimmers to output the monitored result.

Embodiments of inventive concepts provide an erasing method of nonvolatile memory device, the method comprising providing the nonvolatile memory device including a memory string perpendicular to a substrate of a first conductivity, the memory string including a string select transistor, a plurality of memory cells and a ground select transistor using a pillar active body of the first conductivity contacting the substrate, applying a word line erase voltage to a plurality of word lines connected to the plurality of memory cells, applying a voltage to a ground selection line connected to the ground select transistor, applying an erase voltage to the substrate, and floating the ground selection line in response to a voltage shift of the substrate.

Embodiments of inventive concepts provide a nonvolatile memory device, comprising a substrate, a memory string including a string select transistor, a plurality of memory cells and a ground select transistor using a pillar active body of a first conductivity contacting the substrate, an address decoder configured to apply a word line erase voltage to a plurality of word lines connected to the plurality of memory cells and apply a voltage to a ground selection line connected to the ground select transistor, a substrate bias circuit configured to apply an erase voltage to the substrate, and a substrate monitor circuit configured to sense a voltage shift of the substrate, wherein the address decoder floats the ground selection line in response to the voltage shift of the substrate.

Embodiments of inventive concepts provide An erasing method of a nonvolatile memory device including a substrate and a plurality of memory blocks, each including a plurality of memory strings in a two-dimensional array, each including a string selection transistor, a plurality of memory cells, and a ground selection transistor, the plurality of memory strings arranged in rows and columns, wherein columns of the plurality of memory strings are each connected to a corresponding bit line by the corresponding string selection transistor and rows of the plurality of memory strings are each connected to a corresponding string select line by the corresponding string selection transistor, the method comprising selecting one of the plurality of memory blocks for erasing, applying a word line erase voltage to a plurality of word lines connected to the plurality of memory cells of the selected memory block, applying a voltage to a ground selection line connected to the ground select transistor of the selected memory block and not to at least one unselected memory blocks, applying an erase voltage to the substrate, and floating the ground selection line of the selected memory block in response to a voltage shift of the substrate.

In example embodiments, the ground selection lines connected to the ground select transistors of the at least one unselected memory blocks are allowed to float.

In example embodiments, the voltage applied to the ground selection line connected to the ground select transistor of the selected memory block is a ground voltage.

In example embodiments, the voltage applied to the ground selection line connected to the ground select transistor of the selected memory block is allowed to float after the erase voltage reaches a threshold voltage.

In example embodiments, methods may further comprise monitoring a voltage of the substrate and when the voltage of the substrate reaches a threshold voltage, ceasing to apply the voltage to the ground selection line connected to the ground select transistor of the selected memory block.

In example embodiments, methods may further comprise floating the string selection lines connected to the string selection transistors for each of the plurality of memory blocks.

Embodiments of inventive concepts provide a nonvolatile memory device, comprising a substrate, a plurality of memory blocks, each including a plurality of memory strings in a two-dimensional array, each string including a string selection transistor, a plurality of memory cells, and a ground selection transistor, the plurality of memory strings arranged in rows and columns, wherein columns of the plurality of memory strings are each connected to a corresponding bit line by the corresponding string selection transistor and rows of the plurality of memory strings are each connected to a corresponding string select line by the corresponding string selection transistor, an address decoder configured to select one of the plurality of memory blocks for erasing, apply a word line erase voltage to a plurality of word lines connected to the plurality of memory cells of the selected memory block, apply a voltage to a ground selection line connected to the ground select transistor of the selected memory block and not to the unselected memory blocks, a substrate bias circuit configured to apply an erase voltage to the substrate, and a substrate monitor circuit configured to sense a voltage shift of the substrate, wherein the address decoder float the ground selection line floating in response to the voltage shift of the substrate.

In example embodiments, the address decoder allows the ground selection lines connected to the ground select transistors of the unselected memory blocks to float.

In example embodiments, the address decoder applies a ground voltage to the ground selection line connected to the ground select transistor of the selected memory block.

In example embodiments, the address decoder allows the voltage of the ground selection line connected to the ground select transistor of the selected memory block to float after the erase voltage reaches a threshold voltage.

In example embodiments, nonvolatile memory device may further comprise a substrate monitor circuit, adapted to monitor a voltage of the substrate and when the voltage of the substrate reaches a threshold voltage generate a ground enable signal, the address decoder ceasing to apply the voltage to the ground selection line connected to the ground select transistor of the selected memory block, in response to the ground enable signal and then floating the ground selection line.

In example embodiments, the substrate monitor circuit may further include first and second trimmers connected between a ground node and a substrate node to which the erase voltage of the substrate is provided and a comparator configured to compare a target voltage and a voltage of a node between the first and second trimmers and output a comparison result to the address decoder.

In example embodiments, if the comparison result indicates the voltage of the substrate has reached the threshold voltage, the address decoder stops applying the voltage to a ground selection line connected to the ground select transistor of the selected memory block.

In example embodiments, the address decoder may further float the string selection line for each of the plurality of memory blocks.

In example embodiments, the address decoder may further include at least two block word line drivers, each configured to generate a block selection signal, a string selection line driver, configured to drive a string selection line of the plurality of memory blocks in response to the block selection signal, a word line driver, configured to drive word lines of the plurality of memory blocks in response to the block selection signal, a ground selection line driver, configured to drive a ground select line of one of the plurality of memory blocks and to receive the ground enable signal from the substrate monitor circuit and a pass circuit, configured to transfer voltages driven by the string selection line driver, the word line driver, and the ground selection line driver to the corresponding lines of the selected one of the plurality of memory blocks in response to the block selection signal.

In example embodiments, the pass circuit includes a plurality of transistors, one to control each of the word lines, each of the string select lines, and each of the ground selection lines.

Embodiments of inventive concepts provide a nonvolatile memory device comprising a memory cell array comprising a plurality of memory cell strings which are provided onto a substrate, a reading and writing circuit connected to the memory cell strings through a plurality of bit lines, and configured to drive the bit lines, and an address decoder connected to the memory cell strings through a plurality of word lines, a string selection line and a ground selection line, and configured to drive the word lines and the selection lines; wherein the address decoder drives the ground selection line in an erasing operation by waiting a delay time before applying a voltage to the substrate.

In example embodiments, when an erasing voltage for the erase operation is started to be applied to the substrate, the address decoder is configured to drive the ground selection line to a ground voltage.

In example embodiments, during the erasing operation, the address decoder is configured to float the ground selection line when a voltage level of the substrate reaches a target voltage level.

Embodiments of inventive concepts provide a nonvolatile memory device, comprising a substrate, a memory string including a string select transistor, a plurality of memory cells and a ground select transistor using a pillar active body of a first conductivity contacting the substrate, an address decoder configured to apply a word line erase voltage to a plurality of word lines connected to the plurality of memory cells and apply a voltage to a ground selection line connected to the ground select transistor, a substrate bias circuit configured to apply an erase voltage to the substrate, and wherein the address decoder waits a delay time and then floats the ground selection line in response to the voltage shift of the substrate.

Embodiments of inventive concepts provide a nonvolatile memory device, comprising a substrate, a plurality of memory blocks, each including a plurality of memory strings in a two-dimensional array, each string including a string selection transistor, a plurality of memory cells, and a ground selection transistor, the plurality of memory strings arranged in rows and columns, wherein columns of the plurality of memory strings are each connected to a corresponding bit line by the corresponding string selection transistor and rows of the plurality of memory strings are each connected to a corresponding string select line by the corresponding string selection transistor, an address decoder configured to select one of the plurality of memory blocks for erasing, apply a word line erase voltage to a plurality of word lines connected to the plurality of memory cells of the selected memory block, apply a voltage to a ground selection line connected to the ground select transistor of the selected memory block and not to the unselected memory blocks, and a substrate bias circuit configured to apply an erase voltage to the substrate, wherein the address decoder waits a delay time and then floats the ground selection line in response to the voltage shift of the substrate.

In example embodiments, the address decoder allows the ground selection lines connected to the ground select transistors of the unselected memory blocks to float.

In example embodiments, the address decoder applies a ground voltage to the ground selection line connected to the ground select transistor of the selected memory block.

In example embodiments, the address decoder allows the voltage of the ground selection line connected to the ground select transistor of the selected memory block to float after the erase voltage reaches a threshold voltage.

In example embodiments, the address decoder may further float the string selection line for each of the plurality of memory blocks.

In example embodiments, the address decoder may further include at least two block word line drivers, each configured to generate a block selection signal, a string selection line driver, configured to drive a string selection line of the plurality of memory blocks in response to the block selection signal, a word line driver, configured to drive word lines of the plurality of memory blocks in response to the block selection signal, a ground selection line driver, configured to drive a ground select line of one of the plurality of memory blocks and to receive a time delay signal and a pass circuit, configured to transfer voltages driven by the string selection line driver, the word line driver, and the ground selection line driver to the corresponding lines of the selected one of the plurality of memory blocks in response to the block selection signal.

In example embodiments, the pass circuit includes a plurality of transistors, one to control each of the word lines, each of the string select lines, and each of the ground selection lines. address decoderaddress decoderaddress decoderaddress decoderaddress decoderaddress decoder

BRIEF DESCRIPTION OF THE DRAWINGS

The accompanying drawings are included to provide a further understanding of inventive concepts, and are incorporated in and constitute a part of this specification. The drawings illustrate example embodiments of inventive concepts and, together with the description, serve to explain principles of inventive concepts. In the drawings:

FIG. 7 is a table showing a voltage condition in an erasing operation of the nonvolatile memory device of FIG. 1, according to example embodiments of inventive concepts;

FIG. 10 is an example table showing an erase voltage condition based on the erasing method of FIG. 9;

DETAILED DESCRIPTION OF EXAMPLE EMBODIMENTS

Figure 1:
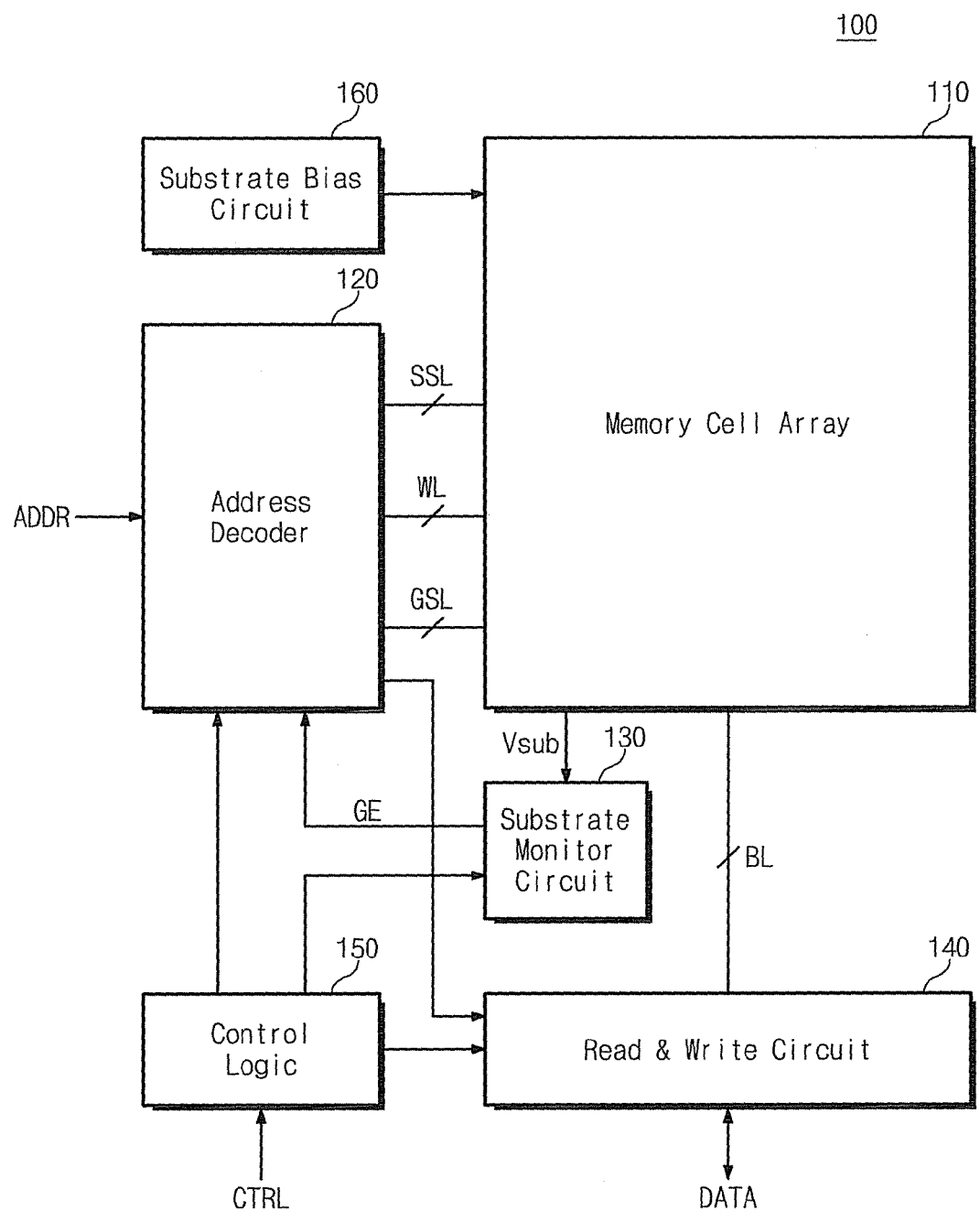
FIG. 1 is a block diagram illustrating a nonvolatile memory device according to example embodiments of inventive concepts.

Example embodiments of inventive concepts will be described below in more detail with reference to the accompanying drawings. The inventive concepts may, however, be embodied in different forms and should not be construed as limited to example embodiments set forth herein. Rather, these example embodiments are provided so that this disclosure will be thorough and complete, and will fully convey the scope of inventive concepts to those skilled in the art. Like reference numerals refer to like elements throughout. Similar reference numerals refer to similar elements throughout.

FIG. 1 is a block diagram illustrating a nonvolatile memory device 100 according to example embodiments of inventive concepts.

Referring to FIG. 1, a nonvolatile memory device 100 according to an embodiment of the inventive concept includes a memory cell array 110, an address decoder 120 (which also acts as an address decoder), a substrate monitor circuit 130, a reading and writing circuit 140, a control logic 150, and/or a substrate bias circuit 160.

The memory cell array 110 is connected to the address decoder 120 through selection lines that include word lines WL, string selection lines SSL and ground selection lines GSL. The memory cell array 110 is connected to the reading and writing circuit 140 through bit lines BL. The memory cell array 110 is connected to the substrate monitor circuit 130. For example, a substrate which the memory cell array 110 is formed on is connected to the substrate monitor circuit 130. The memory cell array 110 is connected to the substrate bias circuit 160. For example, the substrate which the memory cell array 110 is formed on is connected to the substrate bias circuit 160. For example, the substrate is a P type well formed in a N type well in a semiconductor substrate.

The memory cell array 110 includes a plurality of memory blocks. Each of the memory blocks includes a plurality of memory cell strings. For example, the each memory block includes a plurality of NAND strings. Each of the memory cell strings includes a plurality of memory cells and a plurality of selection transistors. For example, the each memory cell string may include at least one string selection transistor and at least one ground selection transistor.

Exemplarily, each of the memory cells arranged in the row direction are respectively connected to a corresponding one of the word lines WL. Memory cells arranged in the column direction in one string are connected to a corresponding one of the bit lines BL. For example, the memory cells arranged in the column direction may configure a plurality of cell groups (for example, a string). Furthermore, the plurality of cell groups are respectively connected to the bit lines BL. At least one string selection transistor is connected to the string selection lines SSL. At least one ground selection transistor is connected to the ground selection lines GSL. Exemplarily, the memory cell array 110 may store one or more bits in each cell.

The address decoder 120 is connected to the memory cell array 110 through the word lines WL, the string selection lines SSL and the ground selection lines GSL. The address decoder 120 operates according to the control of the control logic 150. The address decoder 120 receives an address ADDR inputted from an external device.

The address decoder 120 decodes a row address of the received address ADDR. The address decoder 120 selects a memory block of the memory cell array 110 by using the decoded row address. Also, the address decoder 120 selects the word lines WL, string selection lines SSL and ground selection lines GSL of the selected memory block by using the decoded row address. The address decoder 120 additionally decodes a column address of the received address ADDR. The decoded column address, though not shown, is transferred to the reading and writing circuit 140.

Exemplarily, the address decoder 120 receives a ground enable signal GE from the substrate monitor circuit 130. In response to the received ground enable signal GE, the address decoder 120 controls an output voltage of signals on the WL, SSL and GSL. For example, the address decoder 120 operates in response to the ground enable signal GE during an erasing operation.

The substrate monitor circuit 130 is connected to the memory cell array 110 and the address decoder 120. The substrate monitor circuit 130 operates according to the control of the control logic 150. The substrate monitor circuit 130 monitors a substrate voltage Vsub of the substrate of the memory cell array 110. The substrate monitor circuit 130 activates or deactivates the ground enable signal GE according to the level of the substrate voltage Vsub of the substrate of the memory cell array 110. The ground enable signal GE is transferred to the address decoder 120. For example, the substrate monitor circuit 130 is enabled for an erasing operation.

The reading and writing circuit 140 is connected to the memory cell array 110 through the bit lines BL. The reading and writing circuit 140 operates according to the control of the control logic 150. The reading and writing circuit 140 receives the decoded column address from the address decoder 120. The reading and writing circuit 140 selects some bit lines of the bit lines BL in response to the decoded column address.

Exemplarily, the reading and writing circuit 140 receives data DATA from an external device, for example, a controller and writes the received data DATA into the memory cell array 110. The reading and writing circuit 140 reads the written data DATA from the memory cell array 110 and outputs the read data DATA to the outside. The reading and writing circuit 140 reads data from a first storage region of the memory cell array 110 and writes the read data in a second storage region of the memory cell array 110. For example, the reading and writing circuit 140 performs a copy-back operation.

Exemplarily, the reading and writing circuit 140 includes elements such as a page buffer (or page register) and/or a column selection circuit. As another example, the reading and writing circuit 140 includes elements such as a sensing amplifier, a writing driver and/or a column selection circuit.

The control logic 150 is connected to the address decoder 120, the substrate monitor circuit 130 and the reading and writing circuit 140. For example, the control logic 150 may be additionally connected to the substrate bias circuit 160. The control logic 150 controls the overall operation of the nonvolatile memory device 100. The control logic 150 operates in response to a control signals CTRL from an external device.

The substrate bias circuit 160 operates according to the control of the control logic 150. The substrate bias circuit 160 biases the substrate on which the memory cell array 110 is formed. For example, the substrate bias circuit 160 biases an erase voltage Vers to the substrate on which the memory cell array 110 is formed.

In other example embodiments, the substrate monitor circuit 130 may be omitted. In such example embodiments, the address decoder 120 drives the ground selection line GSL in an erasing operation by waiting a delay time before applying a voltage to the substrate of the memory cell array 110. In example embodiments, the time delay may be predetermined. In example embodiments, the length of the time delay may be provided by the control logic 150 or an external device.

Figure 2:
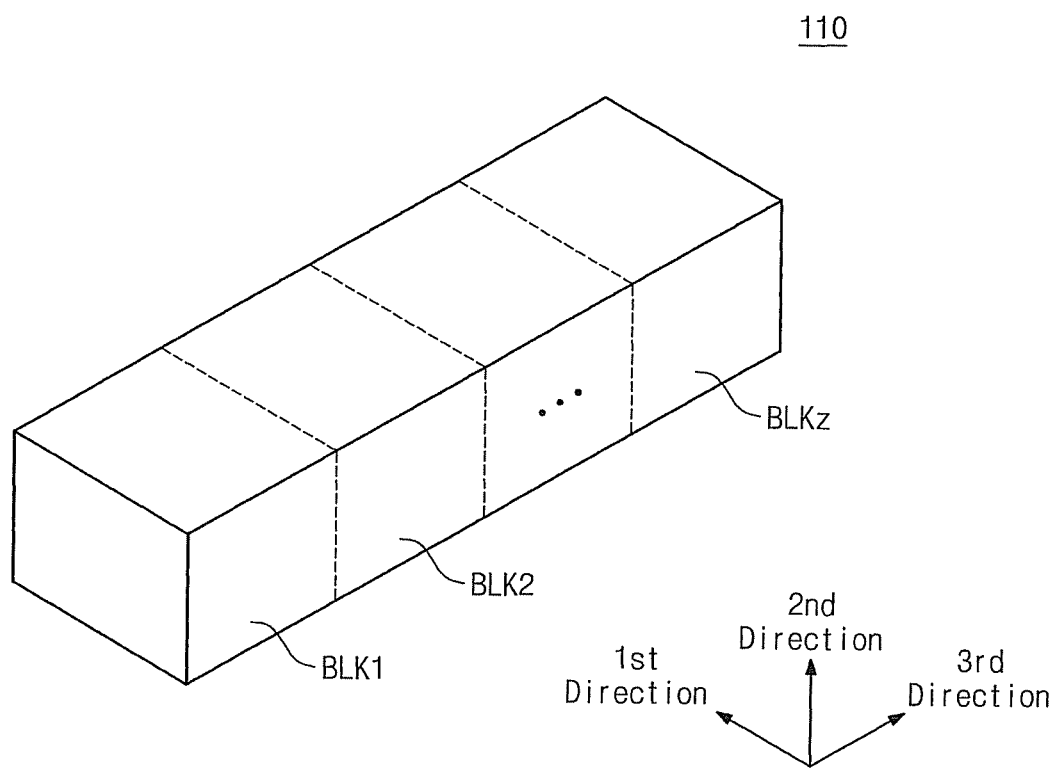
FIG. 2 is an example block diagram of the memory cell array 110 of FIG. 1.

FIG. 2 is a block diagram of the memory cell array 110 of FIG. 1. Referring to FIG. 2, the memory cell array 110 includes a plurality of memory blocks BLK1 to BLKz. Each of the memory blocks BLK has a three-dimensional structure (or vertical structure). For example, each memory block BLK includes structures extending in first to third directions. For instance, each memory block BLK includes a plurality of NAND strings NS extending in the second direction. For example, a plurality of NAND strings NS may be provided in the first and third directions, for example, in a two-dimensional array of NAND strings NS.

Each NAND string NS is connected to a bit line BL, a string select line SSL, a ground select line GSL, the word lines WL, and a common source line CSL. Each of the memory blocks is connected to the plurality of bit lines BL, the plurality of string select lines SSL, the plurality of ground select lines GSL, the plurality of word lines WL, and the common source line CSL. The memory blocks BLK1 to BLKz will be more fully described with reference to FIG. 3.

The memory blocks BLK1 to BLKz are selected by the address decoder 120 illustrated in FIG. 1. For instance, the address decoder 120 is configured to select at least one memory block BLK corresponding to the decoded row address among the memory blocks BLK1 to BLKz.

Figure 3:
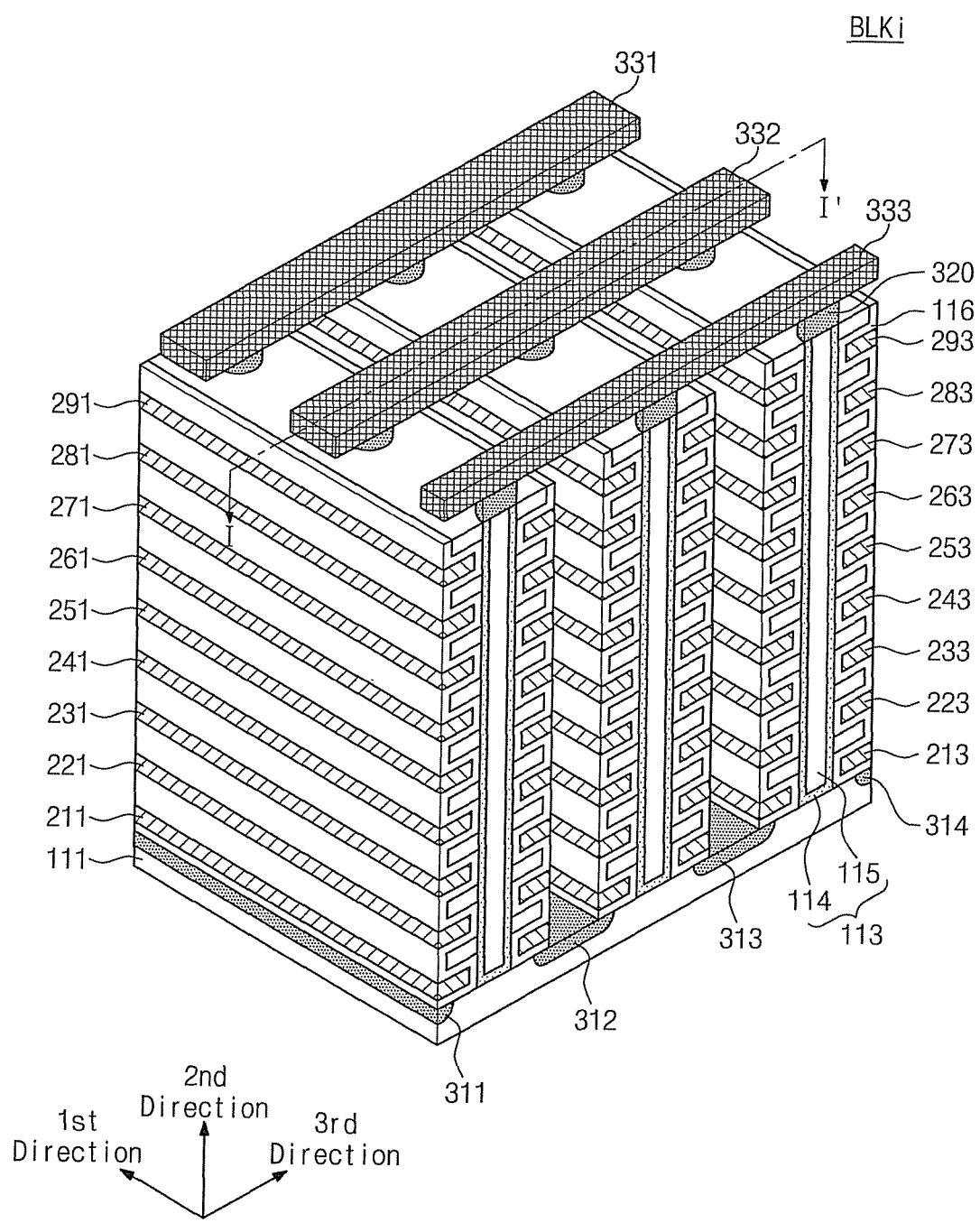
FIG. 3 is a perspective view illustrating example embodiments of one memory block BLKi of the memory blocks BLK1 to BLKz in FIG. 2.
Figure 4:
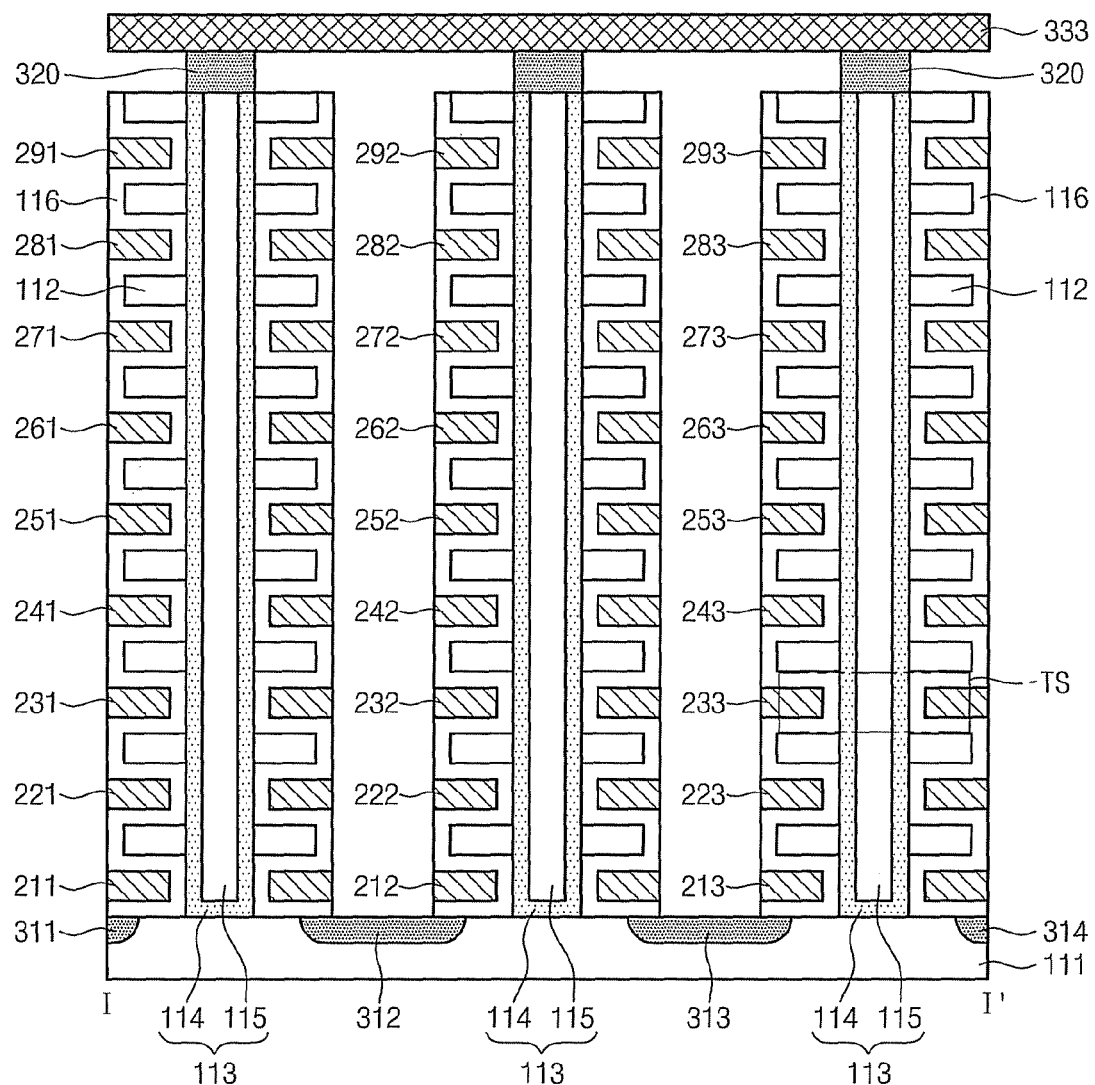
FIG. 4 is a cross-sectional view taken along line I-I' of the memory block BLKi of FIG. 3.

FIG. 3 is a perspective view illustrating example embodiments of one memory block BLKi of the memory blocks BLK1 to BLKz in FIG. 2. FIG. 4 is a cross-sectional view taken along line I-I' of the memory block BLKi of FIG. 3. Referring to FIGS. 3 and 4, the memory block BLKi includes structures extending in the first to third directions.

First, a substrate 111 is provided. The substrate 111 may be a well having a first type (e.g., first conductive type). For example, the substrate 111 may be a p-type well formed by implanting Group III elements such as boron (B). For example, the substrate 111 is a p-type pocket well provided in an n-type well. Hereinafter, it is assumed that the substrate 111 be a p-type well (or p-type pocket well). However, the conductive type of the substrate 111 is not limited to the p-type well.

A plurality of doping regions 311 to 314 extending in a first direction are provided on the substrate 111. For example, the plurality of doping regions 311 to 314 may have a second type (e.g., second conductive type) differing from that of the substrate 111. Hereinafter, it is assumed that the first to fourth doping regions 311 to 314 have an n-type. However, the conductive types of the first to fourth doping regions 311 to 314 are not limited to the n-type.

A plurality of insulation materials 112 extending in the first direction are sequentially provided in a second direction over a region of the substrate 111 between the first and second doping regions 311 and 312. For example, the plurality of insulation materials 112 may be provided in the second direction such that they are spaced by a predetermined or desired distance. The insulation material 112 may include an insulator such as silicon oxide.

A plurality of pillars 113 are provided, which are disposed in the first direction on the region of the substrate 111 between the first and second doping regions 311 and 312 and penetrate the insulation materials 112 in the second direction. Exemplarily, the plurality of pillars 113 penetrate the insulation materials 112 to contact the substrate 111.

Each of the pillars 113 may be composed of a plurality of materials. For instance, a surface layer 114 of each pillar 113 may include a silicon material having a first type. For example, the surface layer 114 of each pillar 113 may include a silicon material having the same type as the substrate 111. Hereinafter, it is assumed that the surface layer 114 of each pillar 113 includes p-type silicon. However, the surface layer 114 of each pillar 113 is not limited to including p-type silicon.

An inner layer 115 of each pillar 113 is composed of an insulation material. For example, the inner layer 115 of each pillar 113 may include an insulation material such as silicon oxide. For example, the inner layer 115 of each pillar 113 may include an air gap. Also a void may be formed in the inner layer 115.

In a region between the first and second doping regions 311 and 312, an insulation layer 116 is provided along exposed surfaces of the insulation materials 112, the pillars 113, and the substrate 111. Exemplarily, the insulation layer 116 provided on the exposed side of the last insulation material 112 disposed in the second direction may be removed along the second direction.

For example, the thickness of the insulation layer 116 may be less than a half of the distance between the insulation materials 112. That is, a region, in which any material other than the insulation materials 112 and the insulation layer 116 may be disposed, may be provided between the insulation layer 116 provided on an undersurface of the first insulation material and the insulation layer 116 provided on a top surface of the second insulation material under the first insulation material of the insulation material 112.

In the region between the first and second doping regions 311 and 312, first conductive materials 211 to 291 are provided on an exposed surface of the insulation layer 116. For example, the first conductive material 211 extending in the first direction is provided between the substrate 111 and the insulation layer adjacent thereto. More specifically, the first conductive material 211 extending in the first direction is provided between the substrate 111 and the insulation layer 116 disposed under the insulation material 112 adjacent to the substrate 111. Between the insulation layer 116 on a top surface of a specific insulation material and the insulation layer disposed on an undersurface of an insulation layer provided on top of the specific insulation material among the insulation materials 112, the first conductive material extending in the first direction is provided. Exemplarily, a plurality of first conductive materials 221 to 281 extending in the first direction are provided between the insulation materials 112. Exemplarily, the first conductive materials 211 to 291 may be a metallic material. Exemplarily, the first conductive materials 211 to 291 may be a conductive material such as polysilicon.

A structure identical to a structure disposed on the first and second doping regions 311 and 312 is provided in a region between the second and third doping regions 312 and 313. Exemplarily, the plurality of insulation materials 112 extending in the first direction, the plurality of pillars 113 which are sequentially arranged in the first direction and penetrate the plurality of insulation materials 112 in the third direction, the insulation layer 116 provided on the plurality of insulation materials 112 and the exposed surface of the plurality of pillars 112, and the plurality of first conductive materials 212 to 292 extending in the first direction are provided in the region between the second and third doping regions 312 and 313.

A structure identical to a structure disposed on the first and second doping regions 311 and 312 is provided in a region between the third and fourth doping regions 313 and 314. Exemplarily, the plurality of insulation materials 112 extending in the first direction, the plurality of pillars 113 which are sequentially arranged in the first direction and penetrate the plurality of insulation materials 112 in the third direction, the insulation layer 116 provided on the plurality of insulation materials 112 and the exposed surface of the plurality of pillars 113, and the plurality of first conductive materials 213 to 293 extending in the first direction are provided in the region between the third and fourth doping regions 313 and 314.

Drains 320 are respectively provided on the plurality of pillars 113. Exemplarily, the drains 320 may include a silicon material doped with a second type material. For example, the drains 320 may include a silicon material doped with an n-type material. Hereinafter, it is assumed that the drains 320 include a silicon material doped with an n-type material. However, the drains 320 are not limited to including n-type silicon materials.

Exemplarily, the width of each drain 320 may be greater than the width of the pillar 113 corresponding thereto. For example, each drain 320 may be provided in the shape of a pad on the top surface of the corresponding pillar 113. Exemplarily, each of the drains 320 may extend up to a portion of the surface layer 114 of the corresponding pillar 113.

Second conductive materials 331 to 333 extending in the third direction are provided on the drains 320. The second conductive materials 331 to 333 are arranged in the first direction such that they are spaced apart from each other by a predetermine or desired distance. The second conductive materials 331 to 333 are respectively connected to the drains 320 in the corresponding region. Exemplarily, the drains 320 and the second conductive material 333 extending in the third direction may be connected to each other through respective contact plugs. Exemplarily, the second conductive materials 331 to 333 may be a metallic material. Exemplarily, the second conductive materials 331 to 333 may be a conductive material such as polysilicon.

Hereinafter, heights of the first conductive materials 211 to 291, 212 to 292, and 213 to 293 will be defined. The first conductive materials 211 to 291, 212 to 292, and 213 to 293 are defined to have first to ninth heights from the substrate 111 sequentially. That is, the first conductive materials 211 to 213 adjacent to the substrate 111 have the first height. The first conductive materials 291 to 293 adjacent to the second conductive materials 331 to 333 have the ninth height. As an order of the specific conductive materials of the first conductive materials 211 to 291, 212 to 292, and 213 to 293 increases from the substrate 111, the height of the first conductive material increases.

In FIGS. 3 and 4, each of the pillars 113 forms a string together with the insulation layer 116 and the plurality of first conductive materials 211 to 291, 212 to 292, and 213 to 293. For example, each pillar 113, acting as a common active pillar, forms a NAND string NS together with a region adjacent to the insulation layer 116 and an adjacent region of the first conductive materials 211 to 291, 212 to 292, and 213 to 293. The NAND string NS includes a plurality of transistor structures TS. The transistor structure TS will be more fully described with reference to FIG. 5. In example embodiments, a subset of the plurality of transistor structures TS in any given string may be referred to as a substring.

Figure 5:
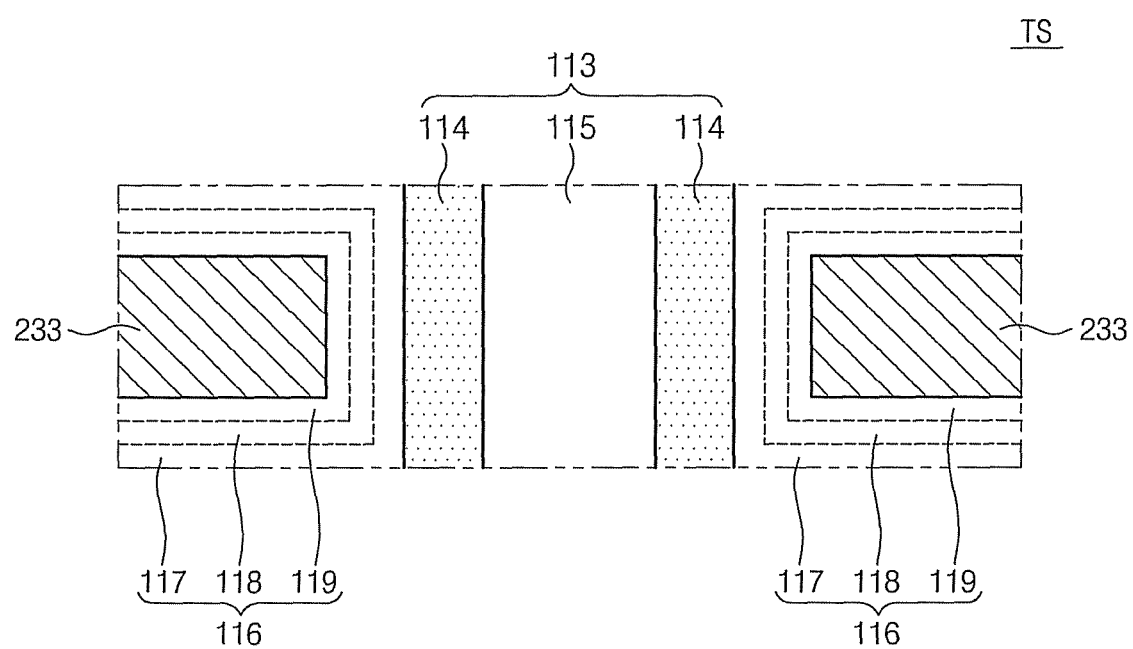
FIG. 5 is a cross-sectional view illustrating the transistor structure TS of FIG. 4.

FIG. 5 is a cross-sectional view illustrating the transistor structure TS of FIG. 4. Referring to FIGS. 3 to 5, the insulation layer 116 includes first to third sub insulation layers 117, 118 and 119. The surface layer 114 of the pillar 113 containing p-type silicon may act as a body. The first sub insulation layer 117 adjacent to the pillar 113 may act as a tunneling insulation layer. For example, the first sub insulation layer 117 adjacent to the pillar 113 may include a thermal oxide layer.

The second sub insulation layer 118 may act as a charge storage layer. For example, the second sub insulation layer 118 may act as a charge trap layer. For example, the second sub insulation layer 118 may include a nitride layer or a metal oxide layer (e.g., aluminum oxide layer, hafnium oxide layer, etc.).

The third sub insulation layer 119 adjacent to the first conductive material 233 may act as a blocking insulation layer. Exemplarily, the third sub insulation layer 119 adjacent to the first conductive material 133 extending in the first direction may have a mono-layered or multi-layered structure. The third sub insulation layer 119 may be a high dielectric layer (e.g., aluminum oxide layer, hafnium oxide layer, etc.) having a higher dielectric constant than the first and second sub insulation layers 117 and 118.

The first conductive material 233 may act as a gate (or control gate). That is, the first conductive material 233 acting as the gate (or control gate), the third sub insulation layer 119 acting as the blocking insulation layer, the second sub insulation layer 118 acting as the charge trap layer, the first sub insulation layer 117 acting as the tunneling insulation layer, and the surface layer 114 that contains p-type silicon and acts as the body, may form a transistor (or memory cell transistor structure). Exemplarily, the first to third sub insulation layers 117 to 119 may form an ONO structure (oxide-nitride-oxide). Hereinafter, the surface layer 114 of the pillar 113 containing p-type silicon is defined to act as the body in the second direction. In example embodiments, the angles between layers of the pillar 113, the insulation layer 116, and the first conductive material 233 may be right angles, acute angles or obtuse angles.

In the memory block BLKi, one pillar 113 corresponds to one NAND string NS. The memory block BLKi includes the plurality of pillars 113. That is, the memory block BLKi includes the plurality of NAND strings NS. More specifically, the memory block BLKi includes a plurality of NAND strings NS extending in the second direction (or direction perpendicular to the substrate).

Each of the NAND strings NS includes the plurality of transistor structures TS which are stacked in the second direction. At least one of the plurality of transistor structures TS of each NAND string NS acts as a string select transistor SST. At least one of the plurality of transistor structures TS of each NAND string acts as a ground select transistor GST. In example embodiments, a substring of the plurality of transistor structures TS may omit the string select transistor SST and/or the ground select transistor GST.

The gates (or control gates) correspond to the first conductive materials 211 to 291, 212 to 292, and 213 to 293 extending in the first direction. That is, the gates (or control gates) form word lines WL extending in the first direction, and at least two select lines SL (for example, at least one string select line SSL and at least one ground select line GSL).

The second conductive materials 331 to 333 extending in the third direction are connected to one ends of the NAND strings NS. For example, the second conductive materials 331 to 333 extending in the third direction act as bit lines BL. That is, in one memory block BLKi, one bit line BL is connected to the plurality of NAND strings.

The second type doping regions 311 to 314 extending in the first direction are provided at the other ends of the NAND strings NS. The second type doping regions 311 to 314 extending in the first direction act as a common source line CSL.

In summary, the memory block BLKi includes the plurality of NAND strings NS extending in a direction (second direction) perpendicular to the substrate 111, and operate as a NAND flash memory block (e.g., charge trap type) in which the plurality of NAND strings NS are connected to one bit line BL.

In FIGS. 3 to 5, it has been described that the first conductive materials 211 to 291, 212 to 292, and 213 to 293 are provided on nine layers. However, the first conductive materials 211 to 291, 212 to 292, and 213 to 293 are not limited to being provided on the nine layers. For example, the first conductive materials may be provided upon at least eight layers forming memory cells, and at least two layers forming select transistors. Also, the first conductive materials may be provided upon a plurality of layers forming memory cells, and at least two layers forming select transistors. For example, the first conductive materials may also be provided on a layer forming dummy memory cells.

In FIGS. 3 to 5, it has been described that three NAND strings NS are connected to one bit line BL. However, it is not limited that three NAND strings NS are connected to one bit line BL. Exemplarily, m number of NAND strings NS may be connected to one bit line BL in the memory block BLKi. Here, the number of the first conductive materials 211 to 291, 212 to 292, and 213 to 293 extending in the first direction, and the number of doping regions 311 to 314 acting as the common source line CSL may also be adjusted so as to correspond to the number of NAND strings NS connected to one bit line BL.

In FIGS. 3 to 5, it has been described that three NAND strings NS are connected to one of the first conductive materials extending in the first direction. However, it is not limited that three NAND strings NS are connected to one of the first conductive materials. For example, n number of NAND strings NS may be connected to one of the first conductive materials. Here, the number of the second conductive materials 331 to 333 extending in the third direction may also be adjusted to correspond to the number of NAND strings NS connected to one of the first conductive materials.

As illustrated in FIGS. 3 to 5, a sectional area of the pillar 113 in the first and third directions may be smaller as the pillar 113 gets closer to the substrate 111. For example, the sectional area of the pillar 113 in the first and third directions may be varied due to process characteristics or errors.

Exemplarily, the pillar 113 is formed by filling a material such as silicon and insulating materials into a hole formed by etching. As the etched depth is greater, an area of the hole in the first and third directions which is formed by etching may be smaller. That is, the sectional area of the pillar 113 in the first and third directions may be smaller as the pillar 113 gets closer to the substrate 111.

Figure 6:
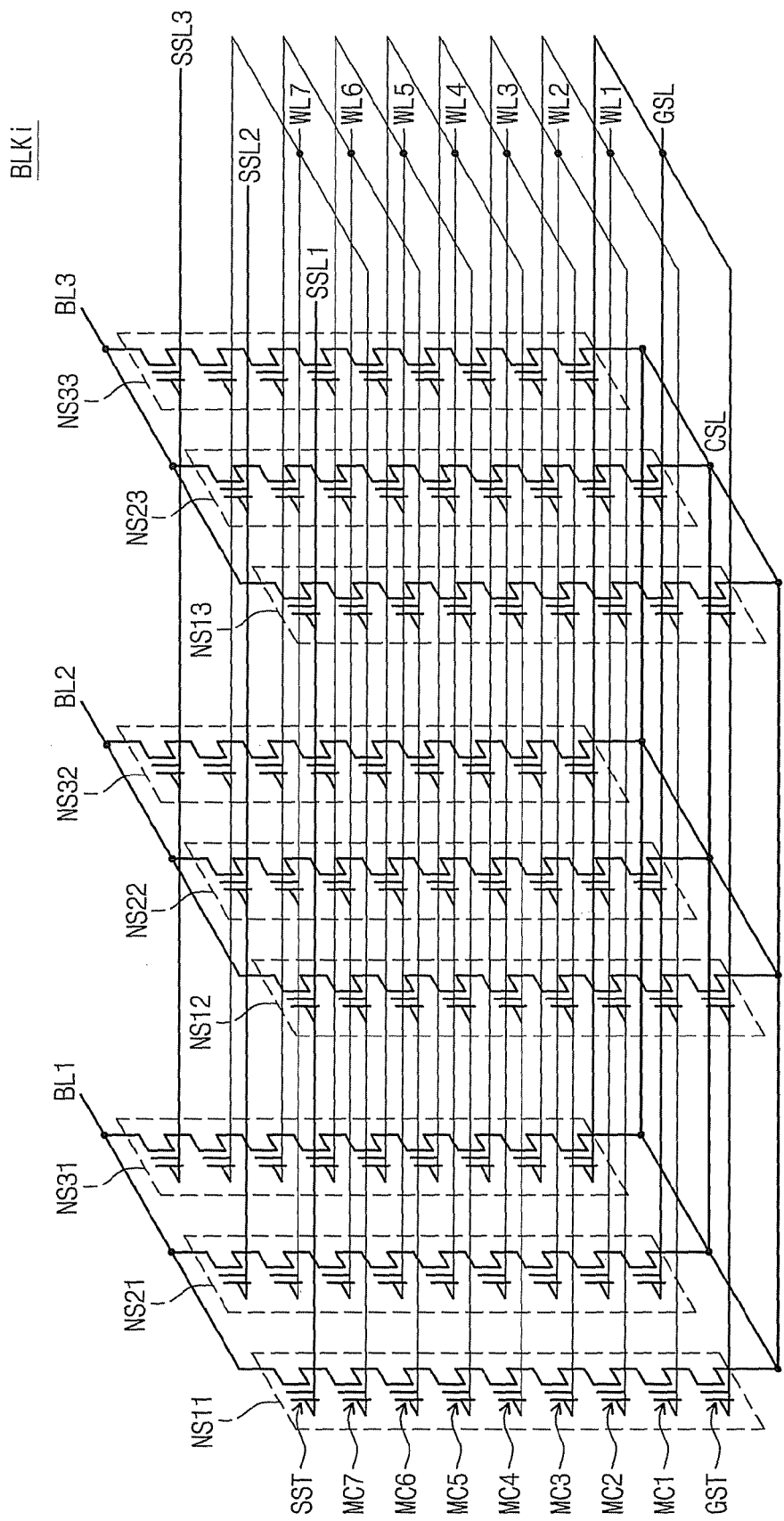
FIG. 6 is a circuit diagram illustrating an equivalent circuit BLKi_1 according to example embodiments of the memory block BLKi described with reference to FIGS. 3 to 5.

FIG. 6 is a circuit diagram illustrating an equivalent circuit BLKi according to example embodiments of the memory block BLKi described with reference to FIGS. 3 to 5. Referring to FIGS. 3 to 6, NAND strings NS11 to NS31 are provided between a first bit line BL1 and a common source line CSL. NAND strings NS12, NS22 and NS32 are provided between a second bit line BL2 and the common source line CSL. NAND strings NS13, NS23 and NS33 are provided between a third bit line BL3 and the common source line CSL. The first to third bit lines BL1 to BL3 respectively correspond to the second conductive materials 331 to 333 extending in the third direction.

A string select transistor SST of each NAND string NS is connected to the corresponding bit line BL. A ground select transistor GST of each NAND string NS is connected to the common source line CSL. Memory cells MC are provided between the string select transistor SST and the ground select transistor GST of each NAND string NS.

Hereinafter, the NAND strings NS are defined in units of rows and columns. The NAND strings NS commonly connected to one bit line form one column. For example, the NAND strings NS 11 to NS 31 connected to the first bit line BL1 correspond to a first column. The NAND strings NS 12 to NS 32 connected to the second bit line BL2 correspond to a second column. The NAND strings NS13 to NS 33 connected to the third bit line BL3 correspond to a third column.

The NAND strings NS connected to one string select line SSL form one row. For example, the NAND strings NS11 to NS13 connected to the first string select line SSL1 form a first row. The NAND strings NS21 to NS23 connected to the second string select line SSL2 form a second row. The NAND strings NS31 to NS33 connected to the third string select line SSL3 form a third row.

A height is defined in each NAND string NS. Exemplarily, the height of the ground select transistor GST is defined as 1 in each NAND string NS. The height of the memory cell MC1 adjacent to the ground select transistor GST is defined as 2. The height of the string select transistor SST is defined as 9. The height of the memory cell MC6 adjacent to the string select transistor SST is defined as 7.

As an order of the memory cell MC increases from the ground select transistor GST, the height of the memory cell MC increases. That is, first to third memory cells MC1 to MC3 are defined to have second to fourth heights, respectively. Fourth to sixths memory cells MC4 to MC6 are defined to have fifth to seventh heights, respectively.

The NAND strings NS of the same row share the ground select line GSL. The NAND strings NS arranged in different rows share the ground select line GSL. The first conductive materials 211 to 213 having the first height are connected to each other to thereby form the ground select line GSL.

The memory cells MC having the same height in the NAND strings NS of the same row share the word line WL. The word lines WL of the NAND strings NS which have the same height and correspond to different rows are commonly connected. That is, the memory cells MC with the same height share the word line WL.

The first conductive materials 221 to 223 having the second height are commonly connected to form the first word line WL1. The first conductive materials 231 to 233 having the third height are commonly connected to form the second word line WL2. The first conductive materials 241 to 243 having the fourth height are commonly connected to form the third word line WL3. The first conductive materials 251 to 253 having the fifth height are commonly connected to form the fourth word line WL4. The first conductive materials 261 to 263 having the sixth height are commonly connected to form the fifth word line WL5. The first conductive materials 271 to 273 having the seventh height are commonly connected to form the sixth word line WL6. The first conductive materials 281 to 283 having the eighth height are commonly connected to form the seventh word line WL7.

The NAND strings NS of the same row share the string select line SSL. The NAND strings NS of different rows are connected to different string select lines SSL1, SSL2 and SSL3, respectively. The first to third string select lines SSL1 to SSL3 correspond to the first conductive materials 291 to 293 having the ninth height, respectively.

Hereinafter, first string select transistors SST1 are defined as the string select transistors SST connected to the first string select line SSL1. Second string select transistors SST2 are defined as the string select transistors SST connected to the second string select line SSL2. Third string select transistors SST3 are defined as the string select transistors SST connected to the third string select line SSL3.

The common source line CSL is commonly connected to all the NAND strings NS. For example, the first to fourth doping regions 311 to 314 are connected to each other to thereby form the common source line CSL.

As illustrated in FIG. 6, the word lines WL having the same height are commonly connected. Therefore, when the word line WL with a specific height is selected, all of the NAND strings NS connected to the selected word line WL are selected.

The NAND strings of different rows are connected to different string select lines SSL. Accordingly, among the NAND strings NS connected to the same word line WL, the NAND strings NS of the unselected row may be electrically isolated from the corresponding bit line and the NAND strings NS of the selected row may be electrically connected to the corresponding bit line by selecting and unselecting the string select lines SSL1 to SSL3.

That is, by selecting and unselecting the string select lines SSL1 to SSL3, the row of the NAND stings NS may be selected. A column of the NAND strings NS of the selected row may be selected.

Exemplarily, one of the string select lines SSL1 to SSL3 is selected during program and read operations. That is, the program and read operations are performed in units of rows of the NAND strings NS11 to NS13, NS21 to NS23, and NS31 to NS33.

Exemplarily, a select voltage is applied to the selected word line of the selected row during the program or read operations, and an unselect voltage is applied to the unselected word lines and the dummy word line DWL. For example, the select voltage is a program voltage Vpgm or selection read voltage Vrd. For instance, the unselect voltage is a pass voltage Vpass or nonselection read voltage Vread. That is, the program and read operations are performed in units of word lines of the selected row of the NAND strings NS11 to NS13, NS21 to NS23, and NS31 to NS33.

Exemplarily, among the first conductive materials 211 to 291, 212 to 292, and 213 to 293, the thickness of the insulation material 112 provided between the first conductive material acting as the select lines and the first conductive material acting as the word lines may be greater than the thickness of other insulation materials 112.

In FIGS. 3 to 6, the first conductive materials 211, 212 and 213 having the first height operates as the ground select line GSL, and the first conductive materials 291, 292 and 293 having the ninth height operates as the string select lines SSL1, SSL2 and SSL3.

Here, the insulation materials 112 provided between the first conductive materials 211, 212 and 213 having the first height and the first conductive materials 221, 222 and 223 having the second height may be greater in thickness than the insulation materials 112 provided between the first conductive materials 221, 222 and 223 having the second height and the conductive materials 281, 282 and 283 having the eighth height.

Likewise, the insulation materials 112 provided between the first conductive materials 281, 282 and 283 having the eighth height and the first conductive materials 291, 292 and 293 having the ninth height may be greater in thickness than the insulation materials 112 provided between the first conductive materials 221, 222 and 223 having the second height and the conductive materials 281, 282 and 283 having the eighth height.

Figure 7:
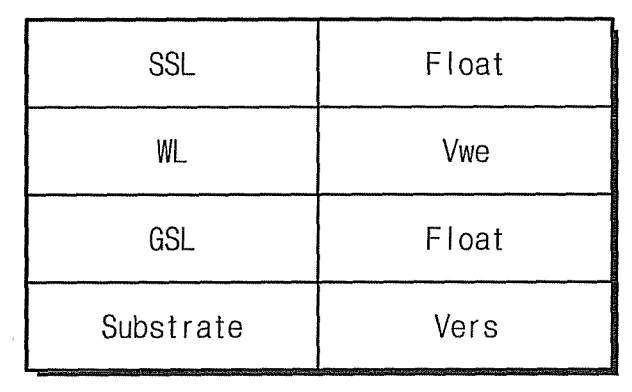

FIG. 7 is a table showing example embodiments of a voltage condition in an erasing operation of the nonvolatile memory device of FIG. 1. Exemplarily, an erasing operation may be performed in memory block units. Exemplarily, the erasing operation will be described below with reference to the memory block BLKi that has been described above with reference to FIGS. 3 to 6.

In the erasing operation, the string selection lines SSL1 to SSL3 are floated. A word line erase voltage Vwe is applied to word lines WL1 to WL7. For example, the word line erase voltage Vwe may be a ground voltage Vss. The ground selection line GSL is floated. Furthermore, an erase voltage Vers is applied to the substrate 111. The substrate 111 and the surface layer 114 acting as a second-direction body may be formed of a silicon material having the same type. Accordingly, the erase voltage Vers applied to the substrate 111 is transferred to the second-direction body 114. Exemplarily, the erase voltage Vers may be a high voltage.

The ground selection line GSL and the string selection lines SSL1 to SSL3 are in a floated state. Therefore, when the voltage of the second-direction body 114 is shifted, a coupling effect is given to the ground selection line GSL and the string selection lines SSL1 to SSL3. That is, when the voltage of the second-direction body 114 increases to the erase voltage Vers, the voltage of the ground selection line GSL and the voltages of the string selection lines SSL1 to SSL3 also increase. Accordingly, the ground selection transistors GST and the string selection transistors SST are prevented from being erased.

The word line erase voltage Vwe is applied to the word lines WL1 to WL7. Exemplarily, the word line erase voltage Vwe is a low voltage. For example, the word line erase voltage Vwe may be the ground voltage Vss. By a voltage difference between the second-direction body 114 and the word lines WL1 to WL7, Fowler-Nordheim tunneling occurs in the memory cells MC1 to MC7. Accordingly, the memory cells MC1 to MC7 are erased.

When the erase voltage Vers is applied to the substrate 111, coupling may occur between the substrate 111 and the ground selection line GSL. For example, when the voltage of the substrate 111 increases, the voltage of the ground selection line GSL may also increase by a coupling effect. When the voltage of the ground selection line GSL increases, ground selection transistors GST may be turned on. That is, a region corresponding to the ground selection transistors GST in the second-direction body 114 may be inverted.

Figure 8:
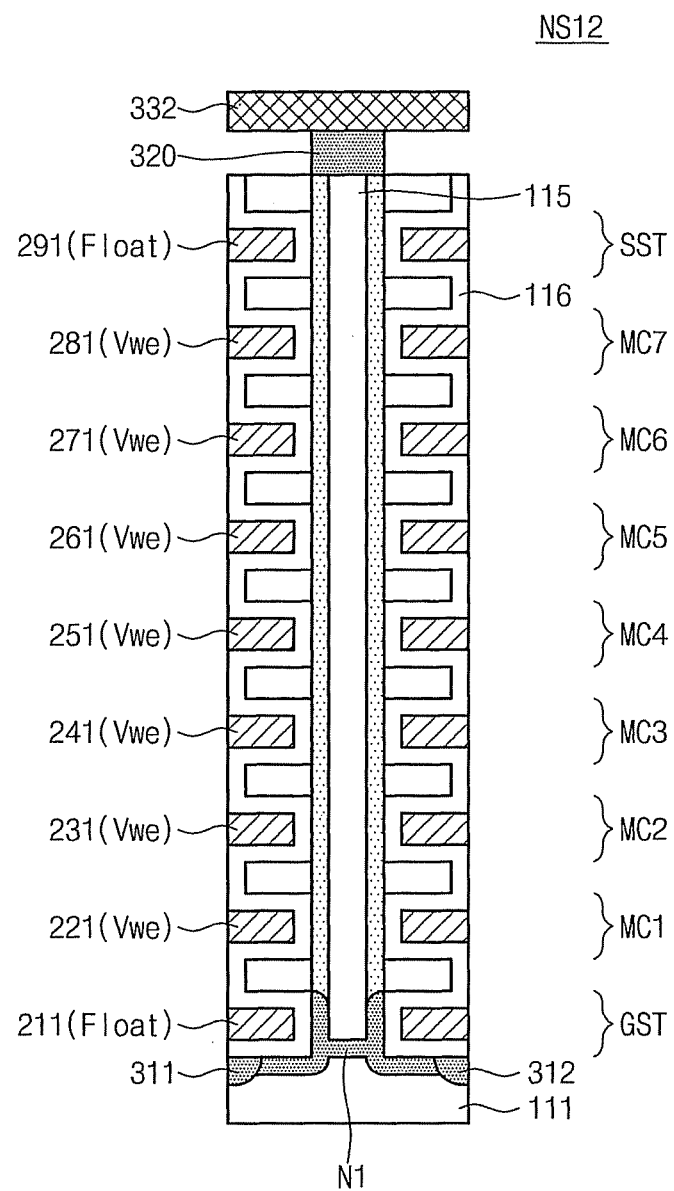
FIG. 8 is a cross-sectional view illustrating one of NAND strings of a memory block which will be described below with reference to FIGS. 3 to 6.

FIG. 8 is a cross-sectional view illustrating the NAND string NS 12 of the NAND strings NS11 to NS13, NS21 to NS23 and NS31 to NS33 of the memory block BLKi which has been described above with reference to FIGS. 3 to 6. Exemplarily, a case where the ground selection transistor GST is turned on in an erasing operation is illustrated in FIG. 8.

Referring to FIGS. 3 to 8, the substrate 111 is p-type silicon. A region corresponding to the string selection transistor SST and the memory cells MC1 to MC7 in the second-direction body 114 maintains a p-type. On the other hand, a region N1 corresponding to the ground selection transistor GST in the second-direction body 114 is inverted into an n-type. That is, the region corresponding to the string selection transistor SST and the memory cells MC1 to MC7 in the second-direction body 114 is electrically insulated from the substrate 111. Accordingly, the erase voltage Vers applied to the substrate 111 is not transferred to the memory cells MC1 to MC7 in the second-direction body 114, so the memory cells MC1 to MC7 are not erased. For preventing this problem, the nonvolatile memory device according to example embodiments of inventive concepts drives a ground selection line according to the voltage level of the substrate of the memory cell array 110.

Figure 9:
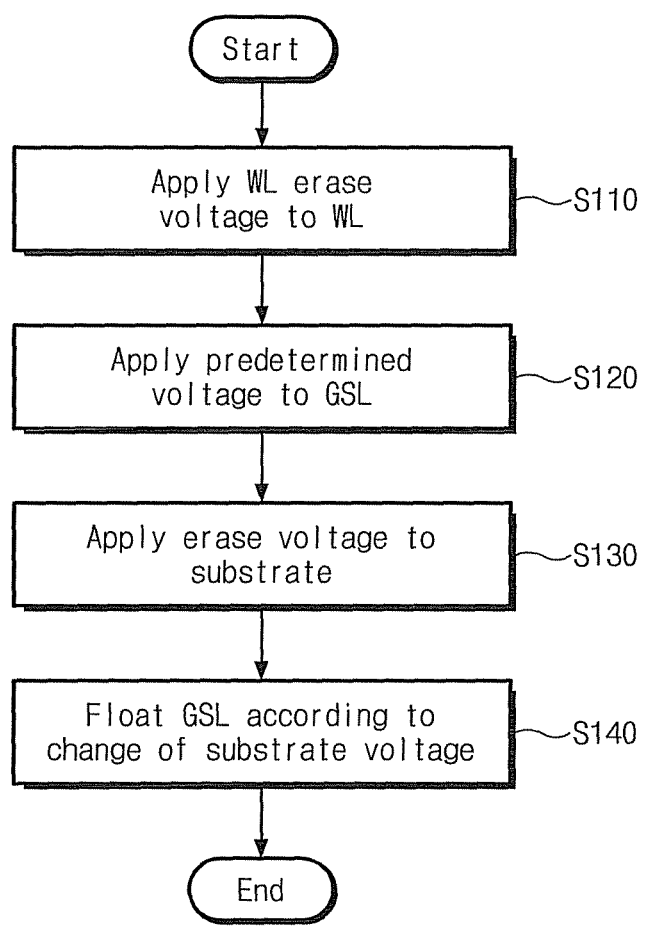
FIG. 9 is a flowchart illustrating an erasing method in the nonvolatile memory device of FIG. 1, according to example embodiments of inventive concepts.

FIG. 9 is a flowchart illustrating an erasing method in the nonvolatile memory device 100 of FIG. 1, according to example embodiments of inventive concepts. Exemplarily, it is assumed that the memory block BLKi which has been described above with reference to FIGS. 3 to 6 is erased. That is, it is assumed that a block word line driver 123 in the address decoder 120 selects the memory block BLKi Referring to FIGS. 1 to 6 and 9, the word line erase voltage Vwe is applied to the word lines WL1 to WL7 in operation S110. For example, the word line erase voltage Vwe is a low voltage. For example, the word line erase voltage Vwe is the ground voltage Vss. For example, the word line erase voltage Vwe has a lower level than the ground voltage Vss. For example, the address decoder 120 drives the word lines WL1 to WL7 with the word line erase voltage Vwe.

A specific voltage Vpd is applied to the ground selection line GSL in operation S120. For example, the specific voltage Vpd is a voltage for turning off the ground selection transistor GST. For example, the specific voltage Vpd has a lower level than the threshold voltage of the ground selection transistor GST. For example, the specific voltage Vpd is the ground voltage Vss. For example, the specific voltage Vpd has a lower level than the ground voltage Vss. For example, the address decoder 120 drives the ground selection line GSL with the specific voltage Vpd.

The erase voltage Vers is applied to the substrate 111 in operation S130. For example, the erase voltage Vers is a high voltage. For example, the substrate bias circuit 160 may supply the erase voltage Vers to the substrate 111.

The ground selection line GSL is floated according to the change of a substrate voltage in operation S140. For example, the substrate monitor circuit 130 monitors the voltage change of the substrate 111 of the memory cell array 110. Based on the voltage change of the substrate 111, the substrate monitor circuit 130 activates or deactivates a ground enable signal GE. In response to the ground enable signal GE, the address decoder 120 applies the specific voltage Vpd to the ground selection line GSL or floats the ground selection line GSL.

Though in FIG. 9 operations S110 to S130 are executed in order, but exemplarily operations S110 to S130 may be performed at the same time. Exemplarily, operations S110 and S120 may be sequentially performed. Exemplarily, operations S110 to S130 may be performed in reverse order. Exemplarily, a string selection line driver 125 in S140 may control the string selection lines SSL1 to SSL3 to be floated while operations 5110 to S130 are being performed.

FIG. 10 is an example table showing an erase voltage condition based on the erasing method of FIG. 9.

Referring to FIGS. 1 to 6, 9 and 10, the string selection lines SSL1 to SSL3 are floated in an erasing operation. In the erasing operation, the word line erase voltage Vwe is applied to the word lines WL1 to WL7. When the erasing operation is started, the specific voltage Vpd is applied to the ground selection line. Subsequently, the ground selection line GSL is floated. In the erasing operation, the erase voltage Vers is applied to the substrate 111.

Figure 11:
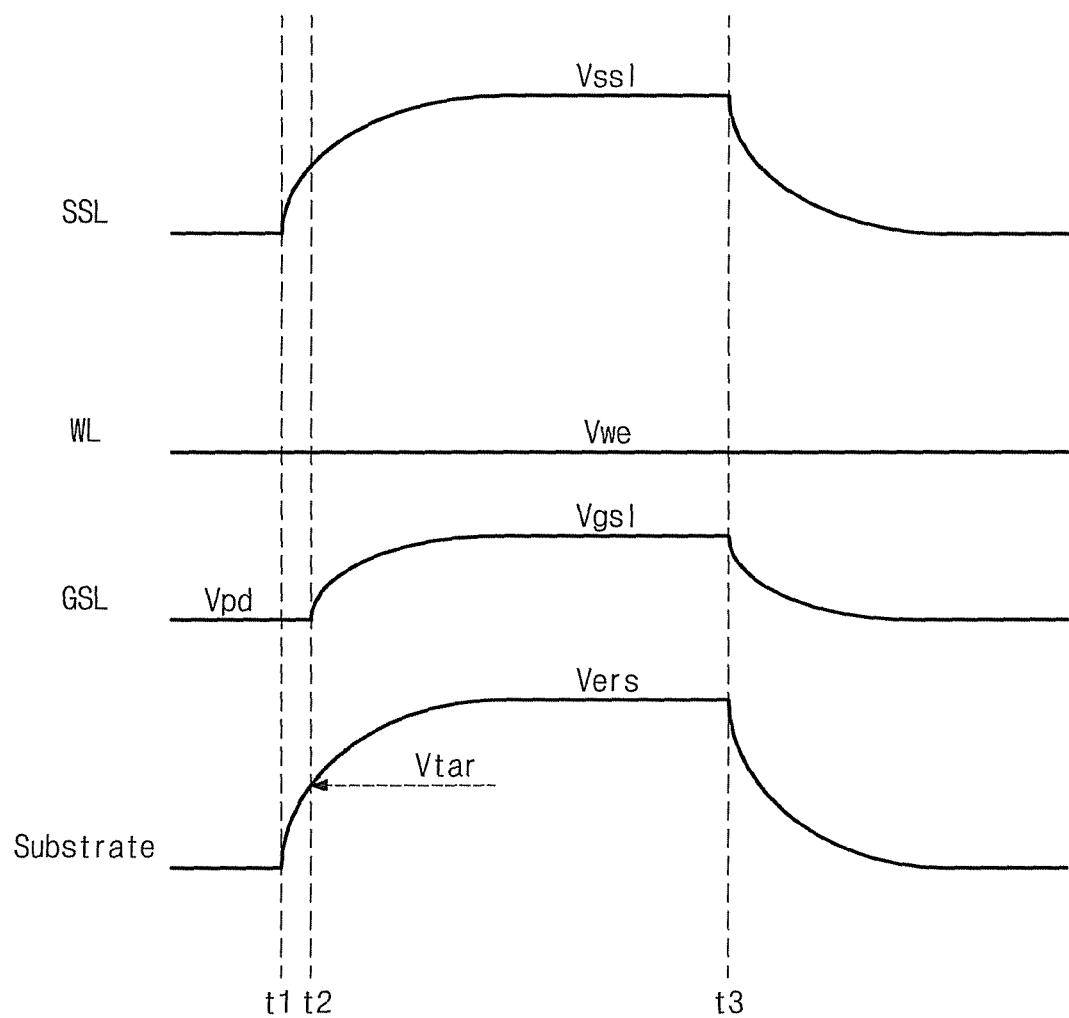
FIG. 11 is an example timing diagram showing voltage shift based on the erasing method of FIG. 9 and the voltage condition of FIG. 10.

FIG. 11 is an example timing diagram showing voltage change based on the erasing method of FIG. 9 and the voltage condition of FIG. 10.

Referring to FIGS. 1 to 6, 9 to 11, once erasing operation begins, the erase voltage Vers is applied to the substrate 111 at a first time t1. That is, the voltage of the substrate 111 begins to increase at the first time t1.

At this point, the specific voltage Vpd is applied to the ground selection line GSL. For example, the ground selection line GSL maintains the ground voltage Vss. Accordingly, the ground selection transistor GST maintains a turn-off state. Therefore, the voltage of the substrate 111 can be transferred to the second-direction body 114. That is, the voltage of the second-direction body 114 increases together with the voltage of the substrate 111.

The word line erase voltage Vwe is applied to the word lines WL1 to WL7.

The string selection lines SSL1 to SSL3 are in a floated state. The voltage change of the second-direction body 114 causes a coupling effect to the string selection lines SSL1 to SSL3. That is, when the voltage of the second-direction body 114 increases together with the substrate 111, the voltages of the string selection lines SSL1 to SSL3 also increase.

At a second time t2, the voltage level of the substrate 111 reaches a threshold or target voltage level Vtar. Once the voltage level of the substrate 111 reaches the threshold or target voltage level Vtar, the ground selection line GSL is floated. For example, the ground selection line driver 129 in FIG. 14A or FIG. 14B floats the ground selection line GSL. After the second time t2, the voltage of the substrate 111 is increased to the level of the erase voltage Vers. As the voltage of the substrate 111 increases, the voltages of the string selection lines SSL1 to SSL3 increase. For example, the voltages of the string selection lines SSL1 to SSL3 may be increased to the level of a string selection line voltage Vss1.

Since the ground selection line GSL is floated from the second time t2, the voltage of the ground selection line GSL increases by a coupling effect after the second time t2. For example, the voltage of the ground selection line GSL may be increased to the level of a ground selection line voltage Vgs1. The voltages of the word lines WL1 to WL7 maintain the level of the word line erase voltage Vwe during the erasing operation. For example, the word line erase voltage Vwe may be the ground voltage Vss.

The erase voltage Vers is applied to the second-direction body 114, and the word line erase voltage Vwe is applied to the word lines WL1 to WL7. By a voltage difference between the second-direction body 114 and the word lines WL1 to WL7, Fowler-Nordheim tunneling occurs in the memory cells MC1 to MC7. Accordingly, the memory cells MC1 to MC7 are erased.

The erase voltage Vers is applied to the second-direction body 114, and the string selection line voltage Vss1 is in the string selection lines SSL1 to SSL3. A voltage difference between the second-direction body 114 and the string selection lines SSL1 to SSL3 is not large enough to induce Fowler-Nordheim tunneling The erase voltage Vers is applied to the second-direction body 114, and a ground selection line voltage Vgs1 is applied to the ground selection line GSL. The voltage of the substrate 111 reaches the target voltage level Vtar, and then the voltage of the ground selection line GSL begins to increase by the coupling effect. That is, the level of the ground selection line voltage Vgs1 is affected by the level of the target voltage Vtar.

When the level of the target voltage Vtar is controlled, the level of the ground selection line voltage Vgs1 can be controlled.

Exemplarily, the level of the target voltage Vtar may be determined not to cause Fowler-Nordheim tunneling by the voltage difference between the erase voltage Vers and the ground selection line voltage Vgs1. For example, the level of the target voltage Vtar may be controlled so that the level of the ground selection line voltage Vgs1 becomes one-half of the level of the erase voltage Vers. Accordingly, the ground selection transistors GST are prevented from being erased.

According to the erasing method according to example embodiments of inventive concepts, as described above, the voltage of the ground selection line GSL is controlled according to the voltage level of the substrate 111. At a time when the erasing operation is started, the ground selection line GSL is applied to a specific voltage. The specific voltage is a voltage for not inverting the region corresponding to the ground selection transistor GST in the second-direction body 114. When the voltage level of the substrate 111 reaches the level of the target voltage Vtar, the ground selection line GSL is floated. That is, the erase disturbance of the memory cells MC1 to MC7 is prevented, and the ground selection transistors GST are prevented from being erased. Accordingly, the reliability of the nonvolatile memory device 100 may be improved.

Figure 12:
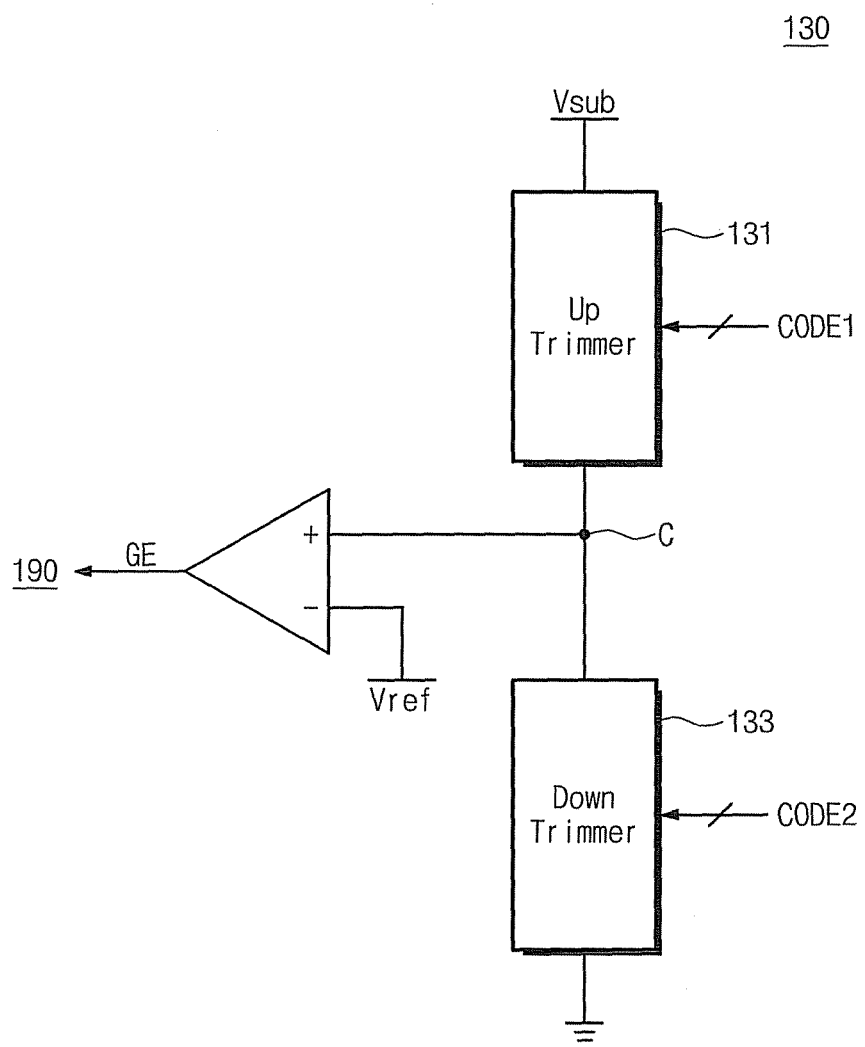
FIG. 12 is an example block diagram illustrating a substrate monitor circuit of FIG. 1.

FIG. 12 is an example block diagram illustrating the substrate monitor circuit 130 of FIG. 1.

Referring to FIG. 12, the substrate monitor circuit 130 includes an up-trimmer 131, a down-trimmer 133, and/or a comparator 135.

A substrate voltage Vsub of the substrate of the memory array is supplied to the up-trimmer 131. The down-trimmer 133 is connected to a ground voltage. An intermediate node C between the up-trimmer 131 and the down-trimmer 133 is connected to the comparator 135. The up-trimmer 131 and the down-trimmer 133 divide the substrate voltage Vsub. For example, the up-trimmer 131 and the down-trimmer 133 may have resistance values. That is, the substrate voltage Vsub that is divided by the up-trimmer 131 and the down-trimmer 133 is supplied to the comparator 135.

Exemplarily, the up-trimmer 131 and the down-trimmer 133 may have variable resistance values. For example, the up-trimmer 131 may control a resistance value in response to a first code signal CODE1. The down-trimmer 133 may control a resistance value in response to a second code signal CODE2.

The comparator 135 compares the voltage of the intermediate node C and a reference voltage Vref. The comparator 135 activates or deactivates the ground enable signal GE according to the result of the comparison. The ground enable signal GE is transferred to the address decoder 120. The address decoder 120 drives the ground selection line GSL of a selected memory block (for example, BLKi) in response to the ground enable signal GE. For example, as described above with reference to FIGS. 9 to 11, the address decoder 120 may drive the ground selection line GSL. That is, the level of the target voltage Vtar may be set according to a division ratio of the up-trimmer 131 and down-trimmer 133 and the level of the reference voltage Vref.

Moreover, the division ratio of the up-trimmer 131 and down-trimmer 133 is controlled by the code signals CODE1 and CODE2. Therefore, the level of the target voltage Vtar may be varied based on the code signals CODE1 and CODE2. These codes CODE1 and CODE2 may be set during a power-up sequence of the nonvolatile memory device using e-fuse data that are stored in the memory array.

In FIG. 12, it has been described above that the output of the comparator 135 is provided as the ground enable signal GE. However, a logic block which controls the output of the comparator 135 to output it as the ground enable signal GE may be additionally provided.

Figure 13:
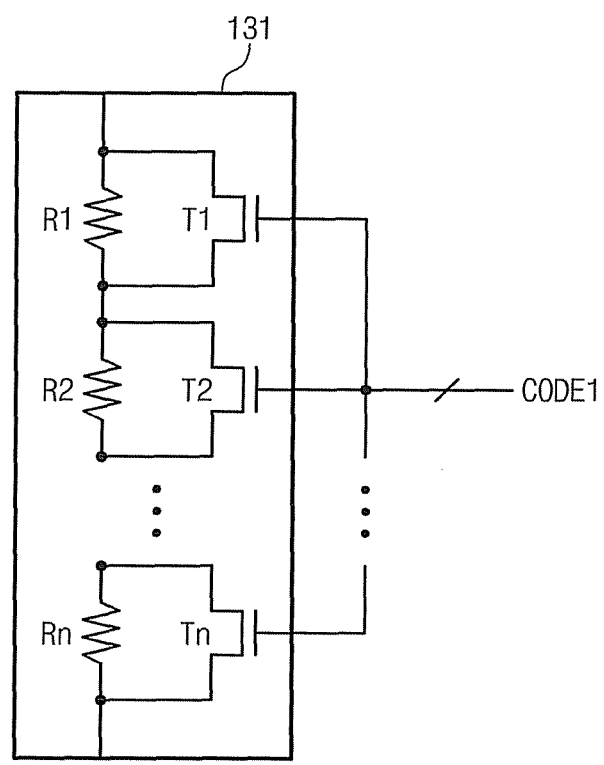
FIG. 13 is an example circuit diagram illustrating an uptrimmer of FIG. 12.

FIG. 13 is an example circuit diagram illustrating the up-trimmer 131 of FIG. 12.

Referring to FIG. 13, the up-trimmer 131 includes first to nth resistors R1 to Rn, and first to nth switches T1 to Tn. Exemplarily, the first to nth switches T1 to Tn are illustrated as transistors, but they are not limited thereto.

The first to nth resistors R1 to Rn are connected in series. The first to nth resistors R1 to Rn and the first to nth transistors T1 to Tn are connected in parallel, respectively. The first to nth transistors T1 to Tn operate in response to the first code signal CODE1. Exemplarily, when the first transistor T1 is turned on, a path detouring the first resistor R1 is provided by the first transistor T1. Accordingly, the resistance value of the up-trimmer 131 decreases. When the first transistor T1 is turned off, the path detouring the first resistor R1 is not provided. Accordingly, the resistance value of the first resistor R1 is reflected in that of the up-trimmer 131. Except for that the second code signal CODE2 is provided, the down-trimmer 133 of FIG. 12 may be configured like the up-trimmer 131. Thus, the detailed description of the down-trimmer 133 will be omitted.

As described above, by performing control based on the first code signal CODE1, the resistance value of the up-trimmer 131 may be controlled. Also, by controlling the second code signal CODE2, the resistance value of the down-trimmer 133 may be controlled. Accordingly, by controlling the first and second code signals CODE1 and CODE2, the level of the target voltage Vtar may be varied.

Figure 14A:
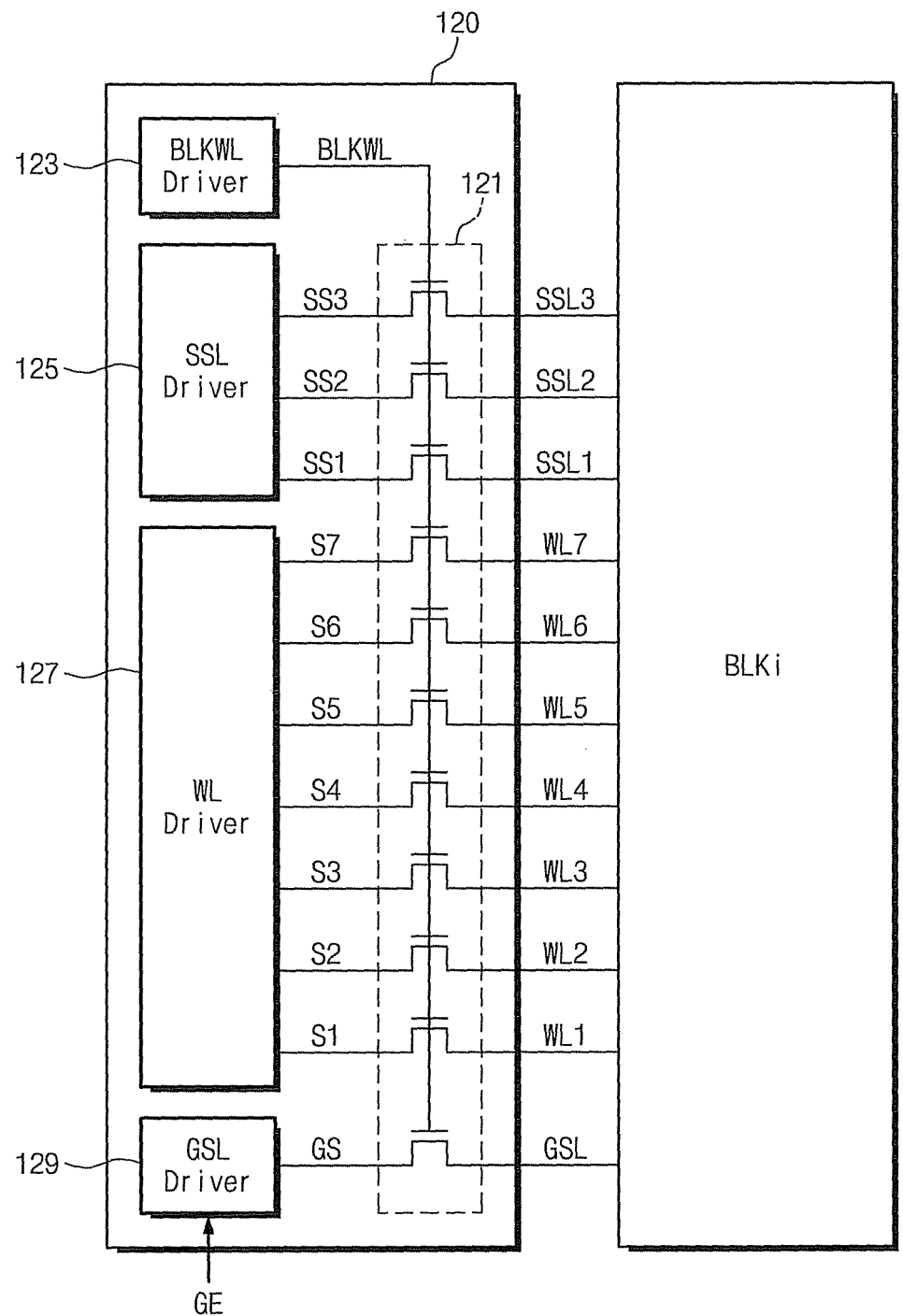
FIG. 14A is an example block diagram illustrating a memory cell array and address decoder of the nonvolatile memory device of FIG. 1.

FIG. 14A is an example block diagram illustrating the memory cell array 110 and address decoder 120 of the nonvolatile memory device of FIG. 1. Exemplarily, the memory block BLKi of the memory cell array 110 is illustrated.

Referring to FIG. 14A, the address decoder 120 includes a pass circuit 121, a block word line driver 123, a string selection line driver 125, a word line driver 127, and a ground selection line driver 129.

The voltage transferring pass circuit 121 transfers voltages on selection lines from the SSL driver, the WL driver, and the GSL driver in response to a BLKWL signal. The pass circuit 121 includes a plurality of switches. Exemplarily, the pass circuit 121 may include a plurality of transistors. Exemplarily, the pass circuit 121 may include a plurality of high voltage transistors.

The gates of the transistors of the pass circuit 121 are connected to a block word line BLKWL in common. Some of the transistors of the pass circuit 121 are connected between the string selection lines SSL1 to SSL3 and selection lines SS1 to SS3, respectively. Some of the transistors of the pass circuit 121 are connected between the word lines WL1 to WL7 and the selection lines S1 to S3, respectively. A portion of the transistors of the pass circuit 121 is connected between the ground selection line GSL and a selection line GS. That is, the pass circuit 121 connects the string selection lines SSL1 to SSL3, the word lines WL1 to WL7 and the ground selection line GSL to the string selection line driver 125, the word line driver 127 and the ground selection line driver 129 in response to the voltage level of the block word line BLKWL, respectively.

The block word line driver 123 drives the block word line BLKWL so that one of memory blocks BLK1 to BLKi of the memory cell array 110 is selected. BLKWL. For example, when the memory block BLKi is selected, the block word line driver 123 applies a selection voltage to the block word line BLKWL. Exemplarily, the block word line driver 123 applies a high voltage Vpp to the block word line BLKWL in a programming operation and a reading operation. Exemplarily, the block word line driver 123 applies a power source voltage Vcc to the block word line BLKWL in an erasing operation.

The string selection line driver 125 is connected to the selection lines SS1 to SS3. The selection lines SS1 to SS3 are connected to the string selection lines SSL1 to SSL3 through the pass circuit 121. That is, the string selection line driver 125 drives the string selection lines SSL1 to SSL3 through the pass circuit 121. For example, the string selection line driver 125 floats the string selection lines SSL1 to SSL3 in the erasing operation.

The word line driver 127 is connected to selection lines S1 to S7. The selection lines S1 to S7 are connected to the word lines WL1 to WL7 through the pass circuit 121, respectively. That is, the word line driver 127 drives the word lines WL1 to WL7 through the pass circuit 121. Exemplarily, the word line driver 127 applies the word line erase voltage Vwe to the word lines WL1 to WL7 in the erasing operation.

The ground selection line driver 129 is connected to the selection line GS. The selection line GS is connected to the ground selection line GSL through the pass circuit 121. That is, the ground selection line driver 129 drives the ground selection line GSL through the pass circuit 121.

In the erasing operation, the ground selection line driver 129 operates in response to the ground enable signal GE. Exemplarily, when the erasing operation is started, the ground selection line driver 129 applies a specific voltage Vpd to the ground selection line GSL. The specific voltage Vpd is a voltage for not inverting the region corresponding to the ground selection transistor GST in the second-direction body 114. When the logical value of the ground enable signal GE is changed, the ground selection line driver 129 floats the ground selection line GSL.

For example, when the ground enable signal GE is changed, the ground selection line driver 129 controls an output in order to float the ground selection line GSL. For example, the ground selection line driver 129 outputs a voltage having the same level as the voltage level of the block word line BLKWL. For example, when the power source voltage Vcc is applied to the block word line BLKWL in the erasing operation, the ground selection line driver 129 outputs the power source voltage Vcc according to the change of the ground enable signal GE. At this point, the gate voltage and drain (or source) voltage of the pass circuit 121 corresponding to the ground selection line GSL become the same. Thus, the transistor of the pass circuit 121 corresponding to the ground selection line GSL is turned off. That is, the ground selection line GSL is floated.

When the ground enable signal GE is changed, the ground selection line driver 129 is not limited to that it outputs a voltage having the same level as the voltage level of the block word line BLKWL. Also, when the ground enable signal GE is changed, the ground selection line driver 129 is not limited to that it outputs the power source voltage Vcc. Exemplarily, when the ground enable signal GE is changed, the ground selection line driver 129 outputs a voltage for turning off the transistor of the pass circuit 121 which corresponds to the ground selection line GSL. Exemplarily, when the ground enable signal GE is changed, the ground selection line driver 129 floats an output node.

As described above, the nonvolatile memory device 100 according to example embodiments of inventive concepts includes a transfer pass circuit 121, a block word line driver 123, a string selection line driver 125, a word line driver 127, and a ground selection line driver 129 for each memory block BLKi of the memory cell array 110. As described above, the nonvolatile memory device 100 according to an embodiment of the inventive concept drives the ground selection line GSL with the change of the substrate voltage of the memory cell array 110 in the erasing operation. Accordingly, the erase disturbance of the memory cells MC1 to MC7 is prevented, and the ground selection transistor GST is prevented from being erased. That is, the reliability of the nonvolatile memory device 100 is improved.

Figure 14B:
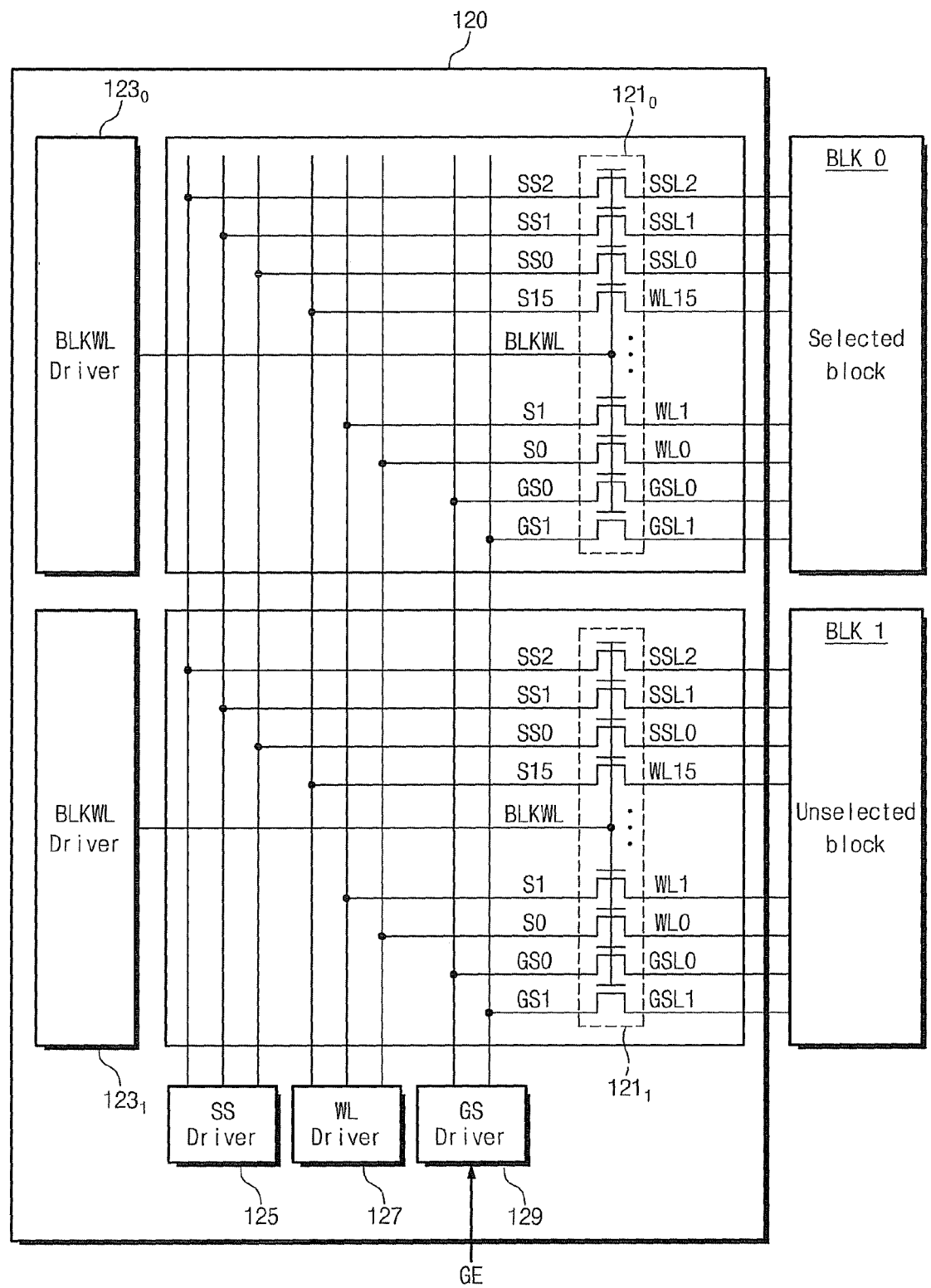
FIG. 14B is another example block diagram illustrating a memory cell array and address decoder of the nonvolatile memory device of FIG. 1.

FIG. 14B is another example block diagram illustrating the memory cell array 110 and address decoder 120' of the nonvolatile memory device of FIG. 1. Exemplarily, memory blocks BLK0 and BLK1 of the memory cell array 110 are illustrated.

Referring to FIG. 14B, in contrast to the address decoder 120 of FIG. 14A, the address decoder 120' includes a transfer pass circuit 1210, 1211 and a block word line driver 1230, 1231 for each memory block BLK0 and BLK1, and one common string selection line driver 125, word line driver 127, and ground selection line driver 129 for all the memory blocks BLKn.

The voltage transferring transfer pass circuits 121n transfer voltages on selection lines from the SSL driver 125, the WL driver 127, and the GSL driver 129 in response to a BLKWL signal from the corresponding block word line driver 123n. The transfer pass circuits 121n include a plurality of switches. Exemplarily, the transfer pass circuit 121n may include a plurality of transistors. Exemplarily, the transfer pass circuits 121n may include a plurality of high voltage transistors.

The gates of the transistors of each transfer pass circuit 121n are connected to a block word line BLKWL in common. Some of the transistors of each transfer pass circuit 121n are connected between the string selection lines SSL1 to SSL3 and selection lines SS1 to SS3, respectively. Some of the transistors of each transfer pass circuit 121n are connected between the word lines WL1 to WL7 and the selection lines S1 to S3, respectively. A portion of the transistors of each transfer pass circuit 121 are connected between the ground selection line GSL and a selection line GS. That is, each transfer pass circuit 121n connects the string selection lines SSL1 to SSL3, the word lines WL1 to WL7 and the ground selection line GSL to the string selection line driver 125, the word line driver 127 and the ground selection line driver 129 in response to the voltage level of the block word line BLKWL, respectively.

Each block word line driver 123n drives the block word line BLKWL so that one of memory blocks BLK1 to BLKi of the memory cell array 110 is selected. For example, when the memory block BLK0 is selected, the block word line driver 1230 applies a selection voltage to the block word line BLKWL. Exemplarily, the block word line driver 1230 applies a high voltage Vpp to the block word line BLKWL in a programming operation and a reading operation. Exemplarily, the block word line driver 1230 applies a power source voltage Vcc to the block word line BLKWL in an erasing operation.

The string selection line driver 125 is connected to the selection lines SS1 to SS3 of each memory block BLKn. The selection lines SS1 to SS3 are connected to the string selection lines SSL1 to SSL3 through the corresponding transfer pass circuit 121n. That is, the string selection line driver 125 drives the string selection lines SSL1 to SSL3 of each memory block BLKn through the corresponding transfer pass circuit 121n. For example, the string selection line driver 125 floats the string selection lines SSL1 to SSL3 in the erasing operation.

The word line driver 127 is connected to selection lines S1 to S7 of each memory block BLKn. The selection lines S1 to S7 are connected to the word lines WL1 to WL7 through the corresponding transfer pass circuit 121n, respectively. That is, the word line driver 127 drives the word lines WL1 to WL7 through the corresponding transfer pass circuit 121n. Exemplarily, the word line driver 127 applies the word line erase voltage Vwe to the word lines WL1 to WL7 in the erasing operation.

The ground selection line driver 129 is connected to the selection line GS of each memory block BLKn. The selection line GS is connected to the ground selection line GSL through the corresponding transfer pass circuit 121n. That is, the ground selection line driver 129 drives the ground selection lines GSL through the corresponding transfer pass circuit 121n.

In the erasing operation, the ground selection line driver 129 operates in response to the ground enable signal GE. Exemplarily, when the erasing operation is started, the ground selection line driver 129 applies a specific voltage Vpd to the ground selection line GSL. The specific voltage Vpd is a voltage for not inverting the region corresponding to the ground selection transistor GST in the second-direction body 114. When the logical value of the ground enable signal GE is changed, the ground selection line driver 129 floats the ground selection line GSL.

For example, when the ground enable signal GE is changed, the ground selection line driver 129 controls an output in order to float the ground selection line GSL. For example, the ground selection line driver 129 outputs a voltage having the same level as the voltage level of the block word line BLKWL. For example, when the power source voltage Vcc is applied to the block word line BLKWL in the erasing operation, the ground selection line driver 129 outputs the power source voltage Vcc according to the change of the ground enable signal GE. At this point, the gate voltage and drain (or source) voltage of the transfer pass circuit 121 corresponding to the ground selection line GSL become the same. Thus, the transistor of the transfer pass circuit 121 corresponding to the ground selection line GSL is turned off. That is, the ground selection line GSL is floated.

When the ground enable signal GE is changed, the ground selection line driver 129 is not limited to that it outputs a voltage having the same level as the voltage level of the block word line BLKWL. Also, when the ground enable signal GE is changed, the ground selection line driver 129 is not limited to that it outputs the power source voltage Vcc. Exemplarily, when the ground enable signal GE is changed, the ground selection line driver 129 outputs a voltage for turning off the transistor of the transfer pass circuit 121n which corresponds to the ground selection line GSL. Exemplarily, when the ground enable signal GE is changed, the ground selection line driver 129 floats an output node.

As described above, the address decoder 120' includes a transfer pass circuit 1210, 1211 and a block word line driver 1230, 1231 for each memory block BLK0 and BLK1, and one common string selection line driver 125, word line driver 127, and ground selection line driver 129 for all the memory blocks BLKn. As described above, the nonvolatile memory device 100 according to an embodiment of the inventive concept drives the ground selection line GSL with the change of the substrate voltage of the memory cell array 110 in the erasing operation. Accordingly, the erase disturbance of the memory cells MC1 to MC7 is prevented, and the ground selection transistor GST is prevented from being erased. That is, the reliability of the nonvolatile memory device 100 is improved.

Figure 15:
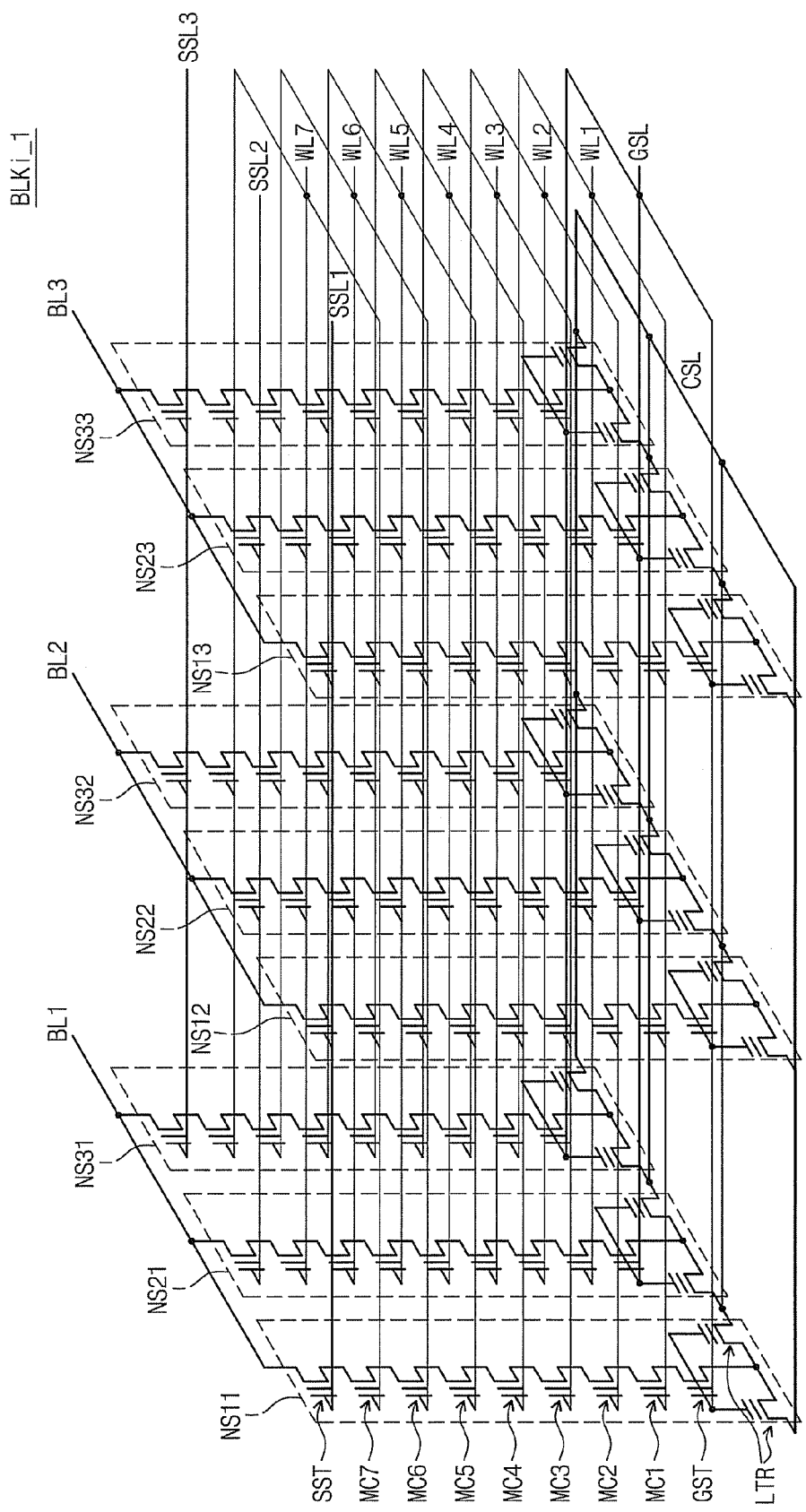
FIG. 15 is a circuit diagram illustrating an equivalent circuit BLKi_1 of the memory block BLKi described with reference to FIGS. 3 and 5 according to example embodiments of inventive concepts.

FIG. 15 is a circuit diagram illustrating an equivalent circuit BLKi_1 of the memory block BLKi described with reference to FIGS. 3 and 5 according to example embodiments of inventive concepts. Compared to the equivalent circuit described with reference to FIG. 6, a lateral transistor LTR is additionally provided at each NAND string NS of the memory block BLKi_1.

In each NAND string NS, the lateral transistor LTR is connected between a ground selection transistor GST and a common source line CSL. A gate (or a control gate) of the lateral transistor LTR and a gate (or control gate) of the ground selection transistor GST are connected to the ground selection line GSL.

As described with reference to FIGS. 3 through 6, the first conductive materials 211, 212, and 213 having the first height correspond to first to third ground selection lines GSL1 to GSL3, respectively.

Once a specific voltage is applied to the first conductive materials 211, 212, and 213 having the first height, a channel is formed in a region of the surface layer 114 adjacent to the first conductive materials 211, 212, and 213. Moreover, if a specific voltage is applied to the first conductive materials 211, 212, and 213, a channel is formed in a region of the substrate 111 adjacent to the first conductive materials 211, 212, and 213.

A first doping region 311 is connected to a channel in the substrate 111, which is formed by a voltage of the first conductive material. The channel of the substrate 111 generated by a voltage of the first conductive material 211 is connected to a channel formed by voltage of the first conductive material 211 in the surface layer 114 operating as a body of the second direction.

Likewise, a channel is formed in the substrate 111 by a voltage of the first conductive materials 211, 212, and 213. First to fourth doping regions 311 to 314 are respectively connected to the surface layers 114 operating as a body of the second direction through a channel formed by a voltage of the first conductive materials 211, 212, and 213 in the substrate 111.

As described with reference to FIGS. 3 through 6, the first to fourth doping regions 311 to 314 are commonly connected to form a common source line CSL. The common source line CSL and the channels of the memory cells MC1 to MC7 are electrically connected through channels perpendicular and parallel to the substrate 111, which are formed by a voltage of the ground selection line GSL.

That is, it is understood that transistors perpendicular and parallel to a substrate, driven by the ground selection line GSL, are provided between the common source line CSL and the first memory cells MC1. A transistor perpendicular to a substrate may be understood as a ground selection transistor GST and a transistor parallel to a substrate may be understood as a lateral transistor LST.

Figure 16:
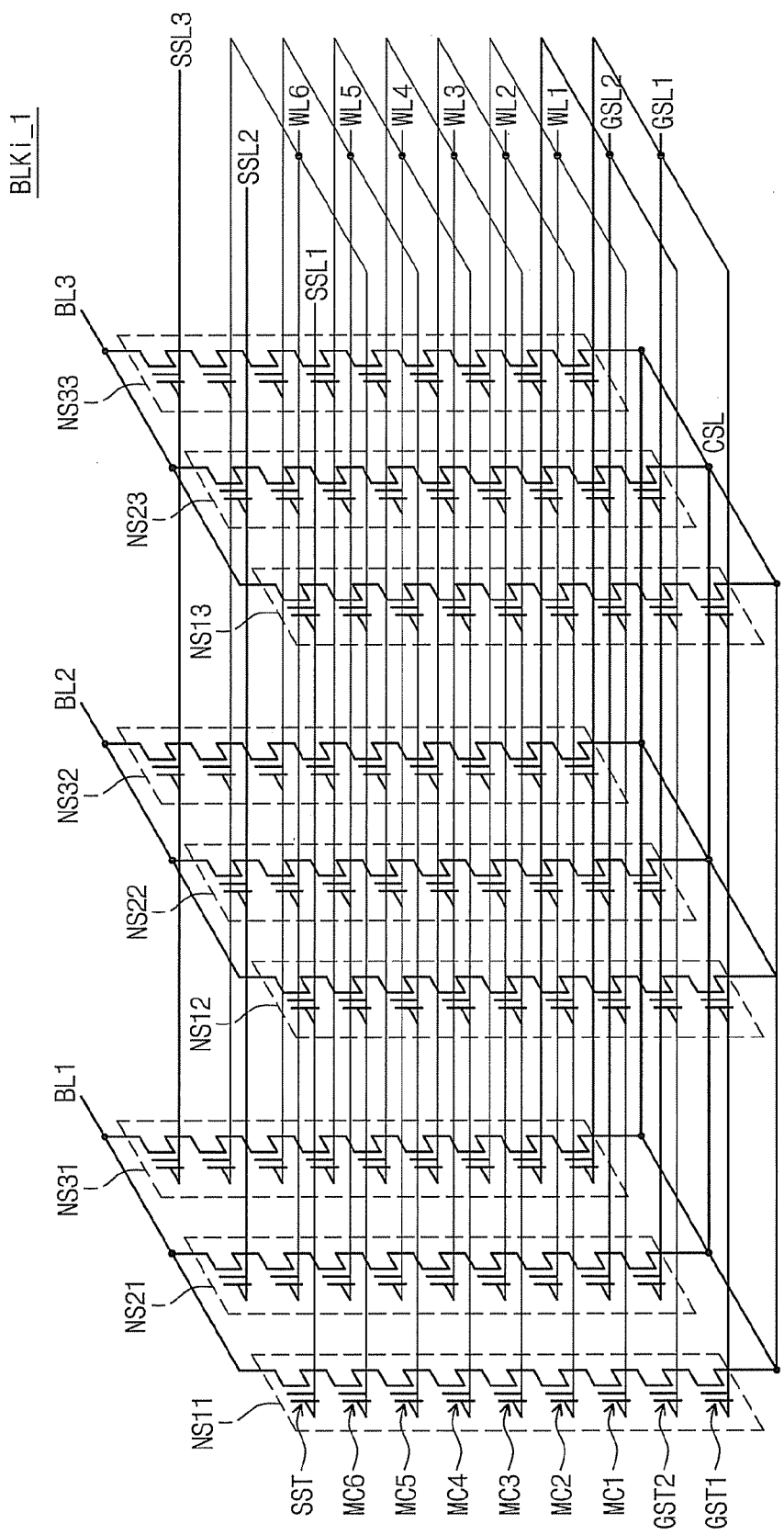
FIG. 16 is a circuit diagram illustrating an equivalent circuit BLKi_1 of the memory block BLKi described with reference to FIGS. 3 and 5 according to example embodiments of inventive concepts.

FIG. 16 is a circuit diagram illustrating an equivalent circuit BLKi_1 of the memory block BLKi described with reference to FIGS. 3 and 5 according to example embodiments of inventive concepts. Compared to the equivalent circuit described with reference to FIG. 6, two ground selection transistors GST1 and GST2 may be provided between the memory cells MC1 to MC6 and the common source line CSL in each NAND string NS. The ground selection lines GSL1 and GSL2 corresponding to the ground selection transistor GST1 or GST2 having the same height may be commonly connected. Moreover, the ground selection lines GSL1 and GSL2 corresponding to the same NAND string NS may be commonly connected.

Figure 17:
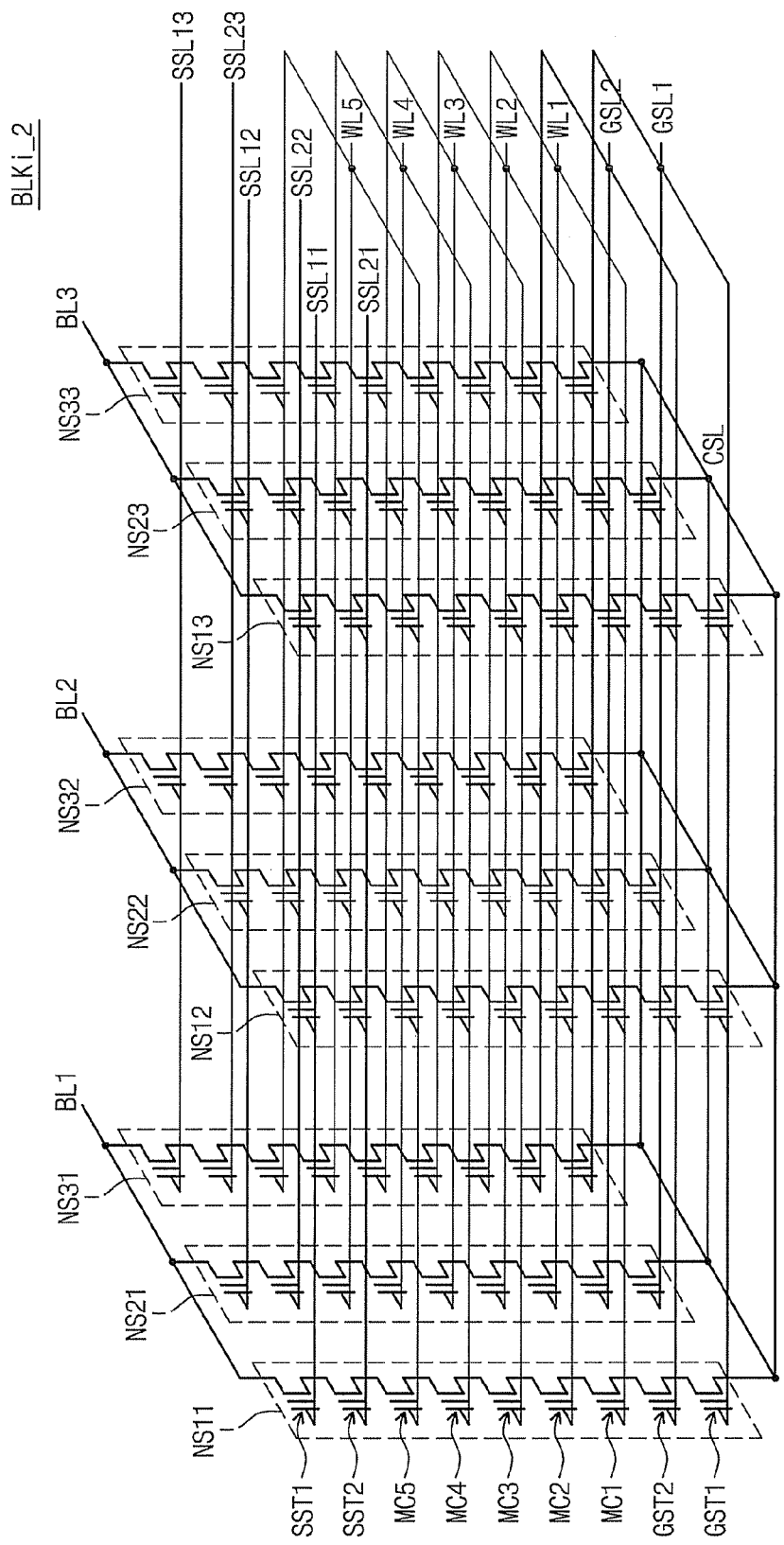
FIG. 17 is a circuit diagram illustrating an equivalent circuit BLKi_2 of the memory block BLKi described with reference to FIGS. 3 and 5 according to example embodiments of inventive concepts.

FIG. 17 is a circuit diagram illustrating an equivalent circuit BLKi_2 of the memory block BLKi described with reference to FIGS. 3 and 5 according to example embodiments of inventive concepts. Compared to the memory block BLKi_1 of FIG. 16, two string selection transistors SSTa and SSTb may be provided between the memory cells MC1 to MC5 and the bit line BL.

In NAND strings in the same row, the string selection transistor SSTa or SSTb having the same height may share one string selection line SSL. For example, in the NAND strings NS11 to NS13 of a first row, the a string selection transistors SSTa share a 1a string selection line SSL1a. The b string selection transistors SSTb share a 1b string selection line SSL1b.

In NAND strings NS21 to NS23 in the second row, the a string selection transistors SSTa share a 2a string selection line SSL2a. The b string selection transistors SSTb share a 2b string selection line SSL2b.

In NAND strings NS21 to NS23 in the third row, the a string selection transistors SSTa share a 3a string selection line SSL3a. The b string selection transistors SSTb share a 3b string selection line SSL3b.

Figure 18:
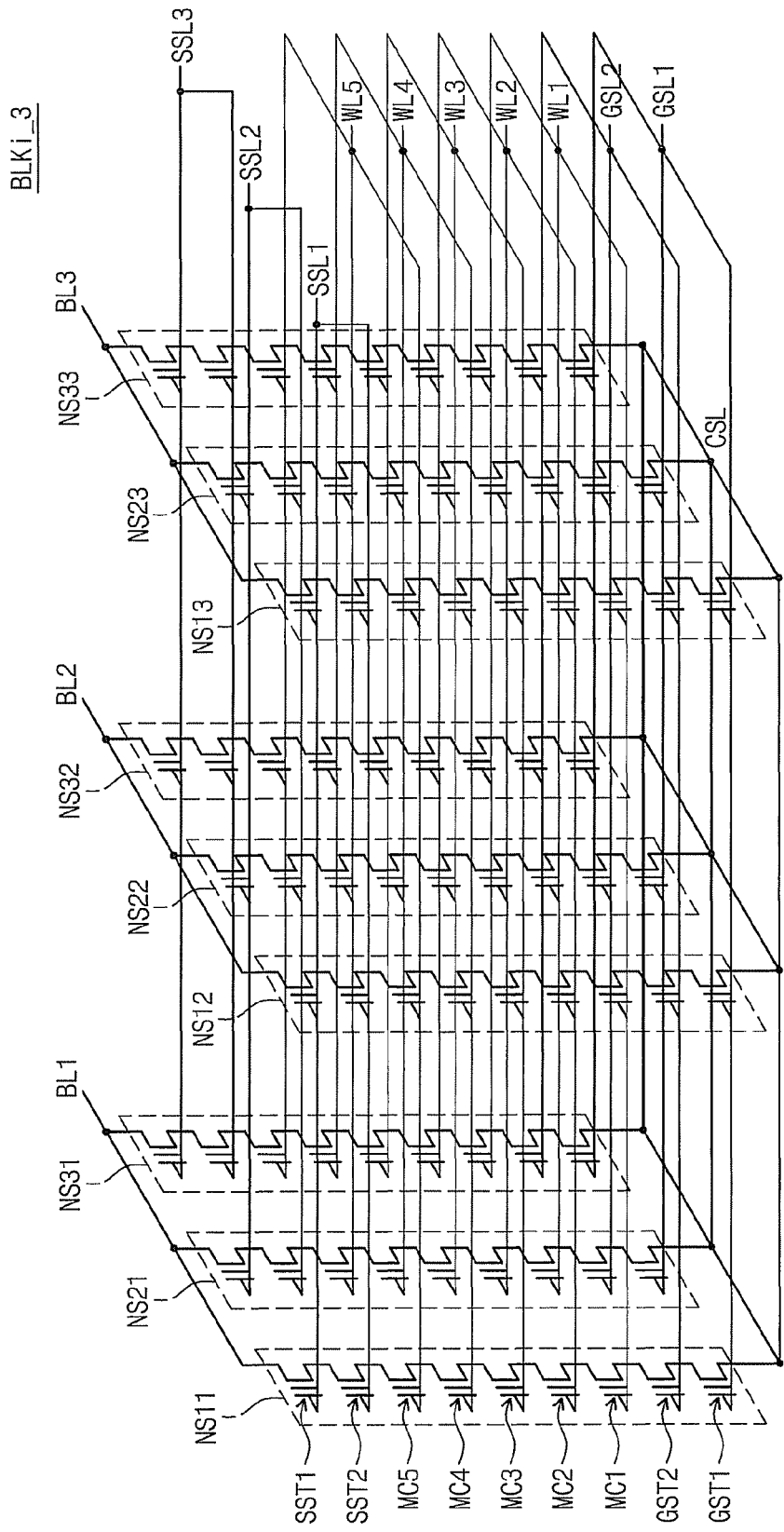
FIG. 18 is a circuit diagram illustrating an equivalent circuit BLKi_3 of the memory block BLKi described with reference to FIGS. 3 and 5 according to example embodiments of inventive concepts.

FIG. 18 is a circuit diagram illustrating an equivalent circuit BLKi_3 of the memory block BLKi described with reference to FIGS. 3 and 5 according to example embodiments of inventive concepts. Compared to the memory block BLKi_2 of FIG. 17, string selection lines SSL corresponding to the NAND strings NS of the same row are commonly connected.

Figure 19:
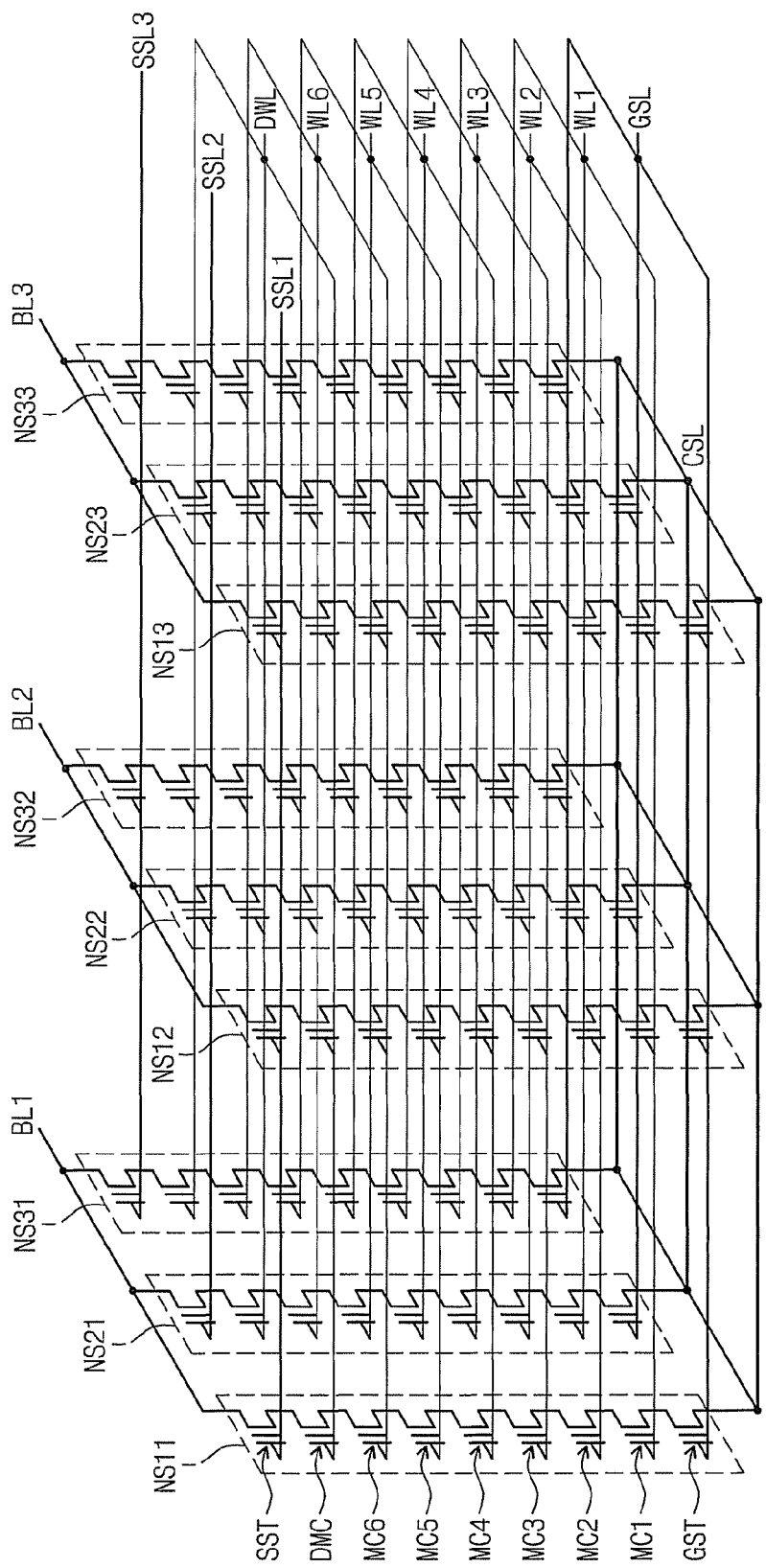
FIG. 19 is a circuit diagram illustrating an equivalent circuit BLKi_4 of the memory block BLKi described with reference to FIGS. 3 and 5 according to example embodiments of inventive concepts.

FIG. 19 is a circuit diagram illustrating an equivalent circuit BLKi_4 of the memory block BLKi described with reference to FIGS. 3 and 5 according to example embodiments of inventive concepts. Compared to the memory block BLKi of FIG. 6, the dummy memory cell DMC is provided between the string selection transistor SST and the memory cells MC6 in each NAND string NS. The dummy memory cells DMC1 are commonly connected to the dummy word lines DWL. That is, the dummy word line DWL is provided between the string selection lines SSL1 to SSL3 and the word line WL6.

Figure 20:
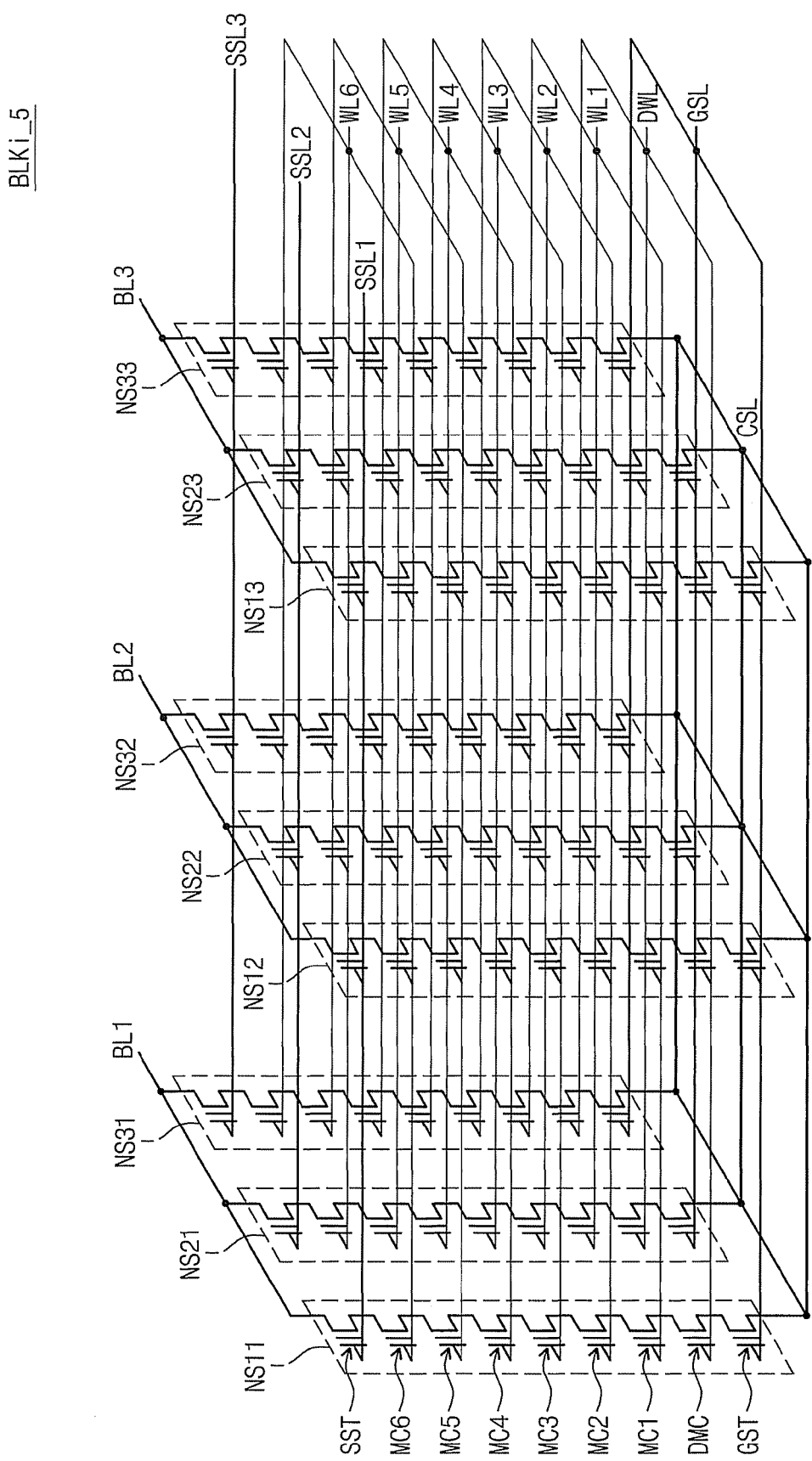
FIG. 20 is a circuit diagram illustrating an equivalent circuit BLKi_5 of the memory block BLKi described with reference to FIGS. 3 and 5 according to example embodiments of inventive concepts.

FIG. 20 is a circuit diagram illustrating an equivalent circuit BLKi_5 of the memory block BLKi described with reference to FIGS. 3 and 5 according to example embodiments of inventive concepts. Compared to the memory block BLKi of FIG. 6, the dummy memory cell DMC is provided between the ground selection transistor GST and the memory cell MC1 in each NAND string NS. The dummy memory cells DMC are commonly connected to the dummy word lines DWL. That is, the dummy word line DWL is provided between the ground selection line GSL and the word lines WL1.

Figure 21:
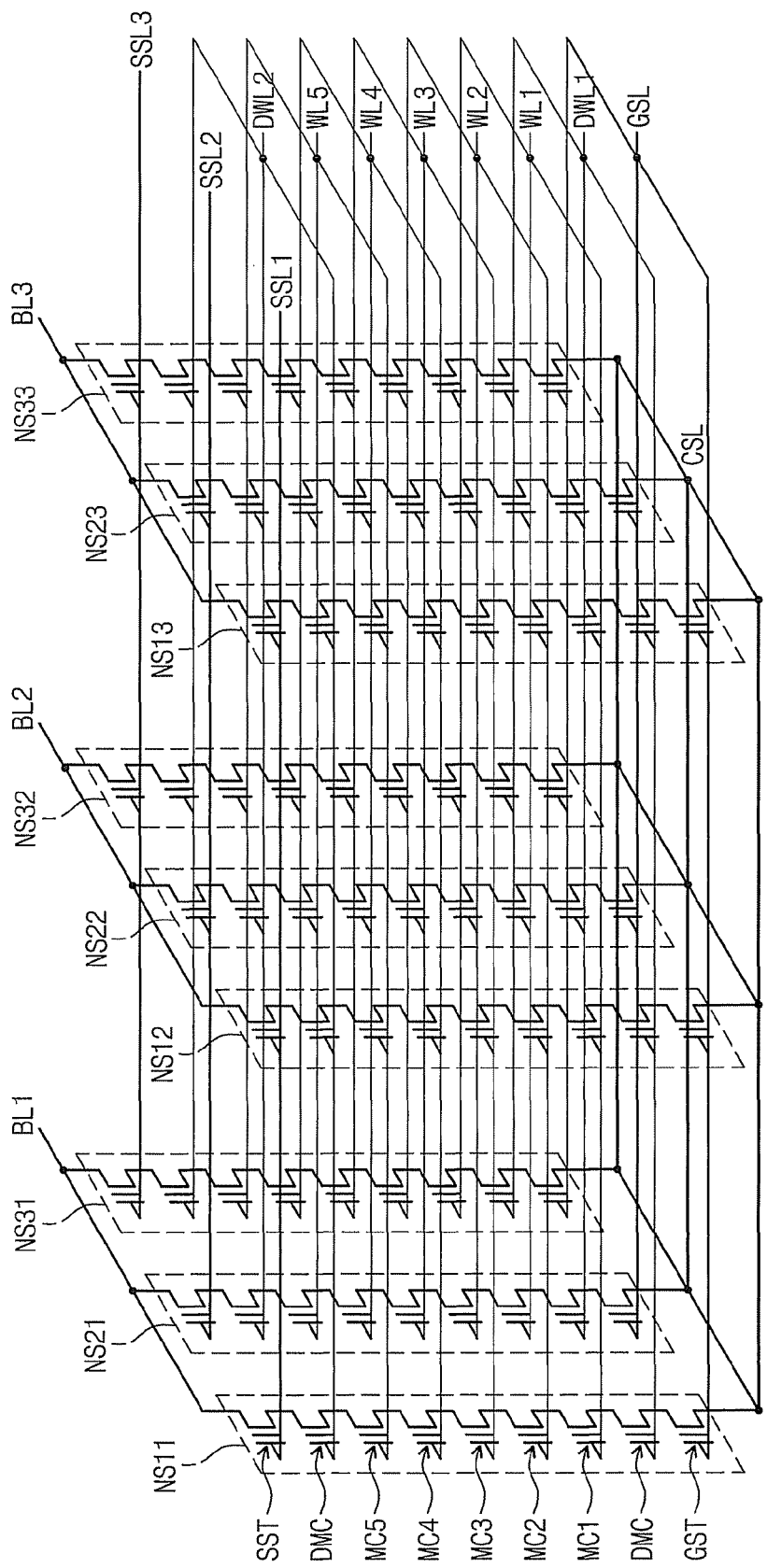
FIG. 21 is a circuit diagram illustrating an equivalent circuit BLKi_6 of the memory block BLKi described with reference to FIGS. 3 and 5 according to example embodiments of inventive concepts.
Figure 22:
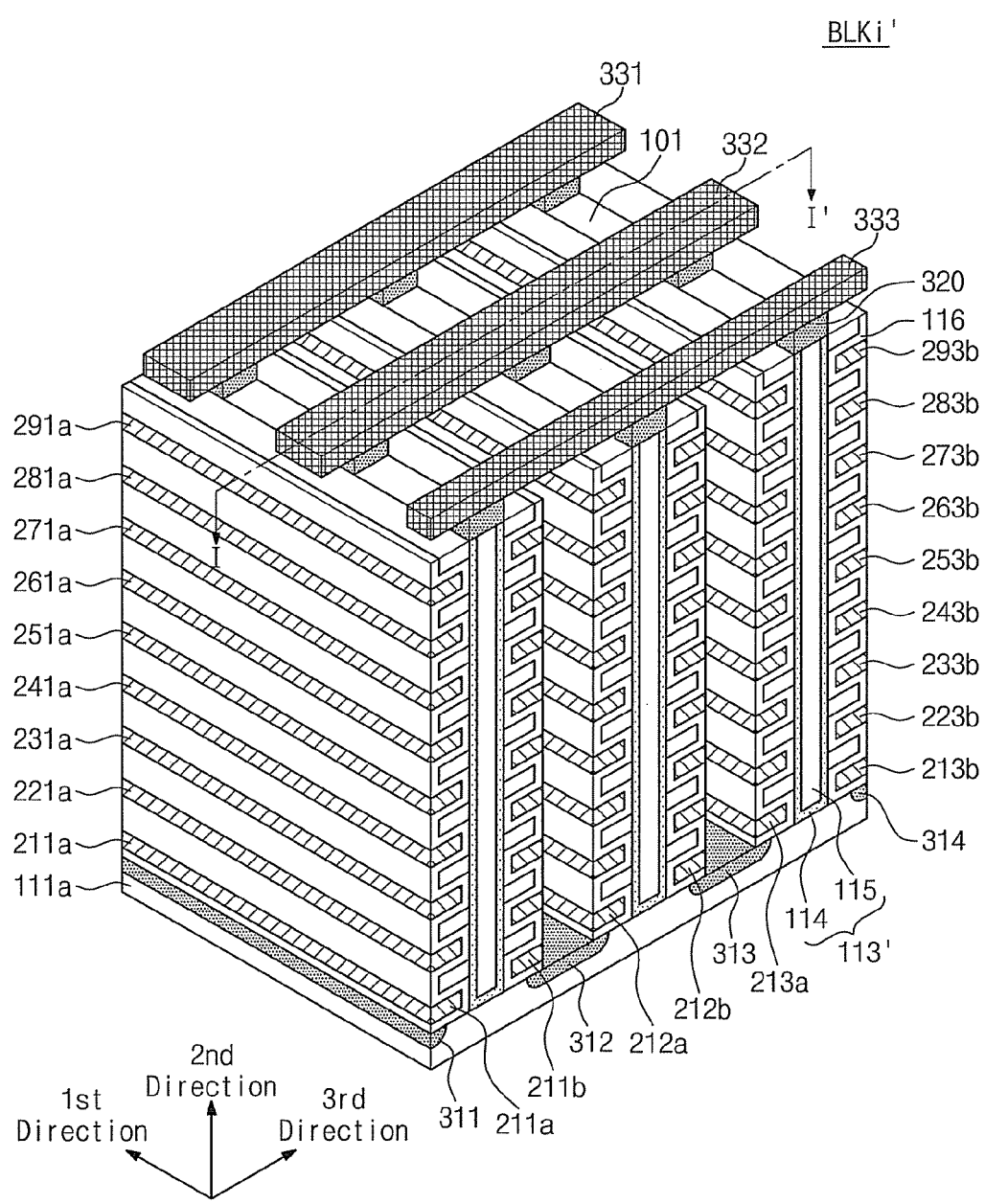
FIG. 22 is a perspective view of one of the memory blocks BLKi according to example embodiments of inventive concepts.

FIG. 21 is a circuit diagram illustrating an equivalent circuit BLKi_6 of the memory block BLKi described with reference to FIGS. 3 and 5 according to example embodiments of inventive concepts. Compared to the memory block BLKi of FIG. 6, a dummy memory cell DMC is provided between the ground selection transistor GST and the memory cell MC1 and between the string select transistor SST and the memory cell MC6 in each NAND string NS. The dummy memory cells DMC are commonly connected to the dummy word lines DWL1 and DWL2. That is, the dummy word line DWL1 is provided between the ground selection line GSL and the word line WL1 and the DWL2 is provided between the string select line SSL and the word line MC5. FIG. 22 is a perspective view of one of the memory blocks BLK1-BLIKz according to example embodiments BLKi' of inventive concepts. A cross-sectional view taken along the line I-I' of the memory block BLKi' is the same as that of FIG. 3.

Compared to the memory block BLKi of FIG. 3, in the memory block BLKi, pillars 113' has a square pillar form. Moreover, between the pillars 113' spaced from each other along the first direction by a specific distance, insulation materials 101 are provided. Exemplarily, the insulation materials 101 extend along the second direction and contact the substrate 111.

The first conductive materials 211 to 291, 212 to 292, and 213 to 293 described with reference to FIG. 3 are divided into first portions 211a to 291a, 212a to 292a, and 213a to 293a and second portions 211b to 291b, 212b to 292b, and 213b to 293b in a region including the insulation materials 101.

In a region on first and second doping regions 311 and 312, each pillar 113' forms the first portions 211a to 291a and insulation layer 116 of the first conductive materials and one NAND string NS and forms the second portions 211b to 291b and insulation layer 116 of the first conductive materials and another NAND string NS.

In a region on second and third doping regions 312 and 313, each pillar 113' forms the first portions 212a to 292a and insulation layer 116 of the first conductive materials and one NAND string NS and forms the second portions 212b to 292b and insulation layer 116 of the first conductive materials and another NAND string NS.

In a region on third and fourth doping regions 313 and 314, each pillar 113' forms the first portions 213a to 293a and insulation layer 116 of the first conductive materials and one NAND string NS and forms the second portions 213b to 293b and insulation layer 116 of the first conductive materials and another NAND string NS.

That is, the first and second portions 211a to 291a and 211b to 291b of the first conductive materials provided at the both sides of each pillar 113' are separated using the insulation material 101, such that each pillar 113' may form two NAND strings.

As described with reference to FIGS. 3 through 6, the first portions 211a to 291a and the second portions 211b to 291b, 212b to 292b, and 213b to 293b of the first conductive materials may correspond to ground selection lines GSL, word lines WL, and string selection lines SST, respectively. The word lines WL having the same height are commonly connected.

Exemplarily, an equivalent circuit of the memory block BLKi' may be illustrated as the equivalent circuit BLKi_1 shown in FIG. 6 except the number of rows in the NAND strings NS. For example, the number of rows in the NAND strings NS of an equivalent circuit of the memory block BLKi' may be two times that in the NAND strings NS of the equivalent circuit BLKi_1 shown in FIG. 6.

Exemplarily, an equivalent circuit of the memory block BLKi' may be illustrated as the equivalent circuits BLKi_2 to BLKi_8 shown in FIGS. 15 through 21 except the number of rows in the NAND strings NS. For example, the number of rows in the NAND strings NS of an equivalent circuit of the memory block BLKi' may be two times that in the NAND strings NS of the equivalent circuits BLKi_2 to BLKi_8 shown in FIGS. 15 through 21.

Each NAND string of the memory block BLKi' may include a lateral transistor LTR. At least one dummy memory cell DMC may be provided between sub blocks of the memory block BLKi'. The number of memory cells DMC, which may be further provided between sub blocks of the memory block BLKi', may vary.

In each NAND string, at least two string selection transistors SST may be provided. In each NAND sting, at least two ground selection transistors GST may be provided. In each NAND string, at least one dummy memory cell DMC may be provided between the memory cells MC and the string selection transistor SST. In each NAND string, at least one dummy memory cell DMC may be provided between the memory cells MC and the ground selection transistor GST.

FIG. 22 is a block diagram illustrating a memory block BLKi of FIG. 2 according to example embodiments of inventive concepts.

Comparing with the memory block BLKi of FIG. 3, in a memory block BLKi', pillars 113' may be provided in a tetragonal pillar shape. Also, insulating materials 101 are provided between the pillars 113' that are disposed in the first direction. Exemplarily, the insulating materials 101 are expanded in the second direction and connected to the substrate 111. Also, the insulating materials 101 are expanded in the first direction in a region other than a region to which the pillars 113' are provided. That is, the conductive materials 211 to 291, 212 to 292 and 213 to 293 that are extended in the first direction and have been described above with reference to FIG. 3 may be divided into two portions 211a to 291a, 211b to 291b, 212a to 292a, 212b to 292b, 213a to 293a and 213b to 293b, respectively. The divided portions 211a to 291a, 211b to 291b, 212a to 292a, 212b to 292b, 213a to 293a and 213b to 293b of the conductive materials may be electrically insulated.

In a region on the first and second doping regions 311 and 312, each of the pillars 113', the portions 211a to 291a of the conductive materials extended in the first direction and the insulation layer 116 may form one NAND string NS, and each of the pillars 113', the portions 211b to 291b of the conductive materials extended in the first direction and the insulation layer 116 may form another NAND string NS.

In a region on the second and third doping regions 312 and 313, each of the pillars 113', the portions 212a to 292a of the conductive materials extended in the first direction and the insulation layer 116 may form one NAND string NS, and each of the pillars 113', the portions 212b to 292b of the conductive materials extended in the first direction and the insulation layer 116 may form another NAND string NS.

In a region on the third and fourth doping regions 313 and 314, each of the pillars 113', the portions 213a to 293a of the conductive materials extended in the first direction and the insulation layer 116 may form one NAND string NS, and each of the pillars 113', the portions 213b to 293b of the conductive materials extended in the first direction and the insulation layer 116 may form in another NAND string NS.

That is, by electrically insulating the conductive materials 211a to 291a and 211b to 291b which are provided to the both-side surfaces of the each pillar 113' and are extended in the first direction with the insulation layer 101, the each pillar 113' may form two NAND strings NS.

A cross-sectional view taken along line I-I' of the memory block BLKi', which has been described above with reference to FIG. 22, is as illustrated in FIG. 4. Accordingly, a cross-sectional view of the memory block BLKi' and its description will be omitted.

Figure 23:
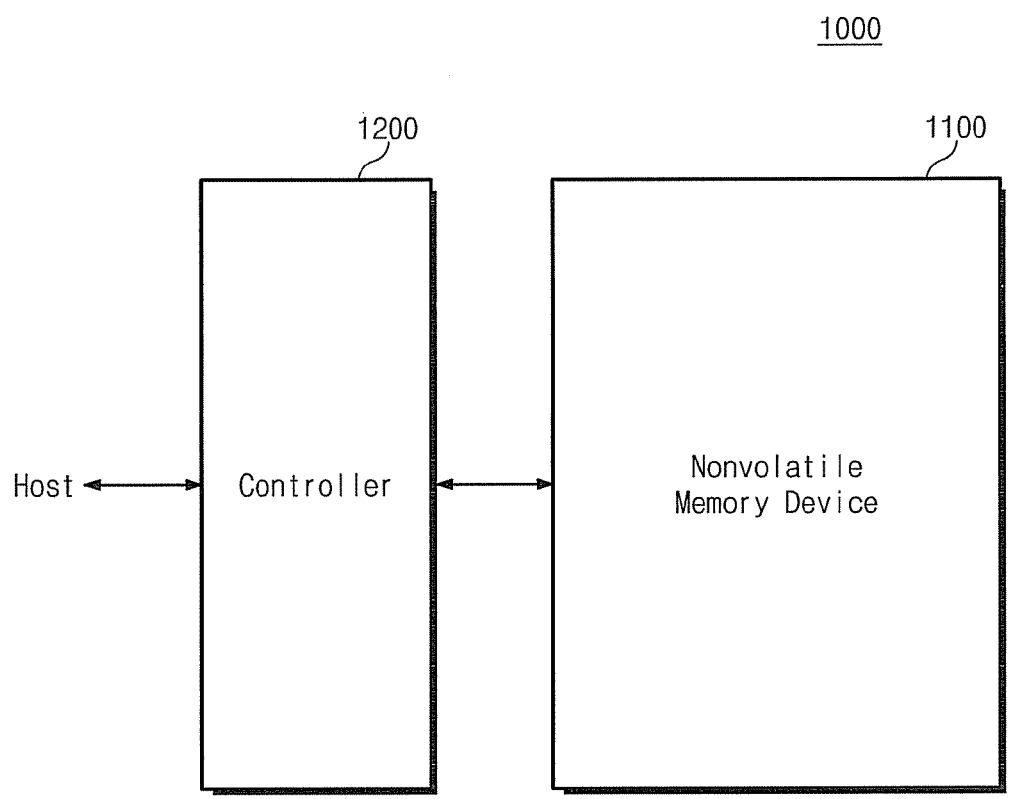
FIG. 23 is a block diagram illustrating a memory system which includes the nonvolatile memory device of FIG. 1, according to example embodiments of inventive concepts.

FIG. 23 is a block diagram illustrating a memory system 1000 which includes the nonvolatile memory device 100 of FIG. 1, according to example embodiments of inventive concepts.

Referring to FIG. 23, a memory system 1000 according to example embodiments of inventive concepts includes a nonvolatile memory device 1100 and a controller 1200.

The nonvolatile memory device 1100 operates, as described above with reference to FIGS. 1 to 22. For example, the nonvolatile memory device 1100 applies a specific voltage to a ground selection line GSL in an erasing operation. With the voltage change of the substrate 111 of the nonvolatile memory device 1100, the nonvolatile memory device 1100 floats the ground selection line GSL. Accordingly, erase disturbance is prevented, and reliabilities for the nonvolatile memory device 1100 and the memory system 1000 including the nonvolatile memory device 1100 are improved.

The controller 1200 is connected to a host and the nonvolatile memory device 1100. In response to a request from the host, the controller 1200 accesses the nonvolatile memory device 1100. For example, the controller 1200 controls the reading, writing, erasing and background operations of the nonvolatile memory device 1100. The controller 1200 provides interface between the nonvolatile memory device 1100 and the host. The controller 1200 drives firmware for controlling the nonvolatile memory device 1100.

Exemplarily, the controller 1200 may further include a RAM, a processing unit, a host interface, and a memory interface. The RAM is used as at least one of a working memory of the processing unit, a cache memory between the nonvolatile memory device 1100 and the host, and a buffer memory between the nonvolatile memory device 1100 and the host. The processing unit controls the overall operation of the controller 1200.

The host interface includes a protocol for data exchange between the host and the controller 1200. Exemplarily, the host interface communicates with external devices (for example, a host) through at least one of various interface protocols such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Component Small Interface (SCSI) protocol, an Enhanced Small Disk Interface (ESDI) protocol and an Integrated Drive Electronics (IDE) protocol.

The memory system 1000 may further include an error correction block. The error correction block detects and corrects the error of data that is read from the nonvolatile memory device 1100 with an Error Correction Code (ECC). Exemplarily, the error correction block is provided as the element of the controller 1200. The error correction block may be provided as the element of the nonvolatile memory device 1100.

The controller 1200 and the nonvolatile memory device 1100 may be integrated as one semiconductor device. Exemplarily, the controller 1200 and the nonvolatile memory device 1100 are integrated as one semiconductor device to configure a memory card. For example, the controller 1200 and the nonvolatile memory device 1100 are integrated as one semiconductor device to configure a memory card such as a PC card (Personal Computer Memory Card International Association (PCMICA)), a compact flash card (CF), a smart media card (SM, SMC), a memory stick, a multimedia card (MMC, RS-MMC, MMCmicro), an SD card (SD, miniSD, microSD, SDHC) and a universal flash memory device (UFS).

The controller 1200 and the nonvolatile memory device 1100 are integrated as one semiconductor device to configure a semiconductor drive (Solid State Drive (SSD)). The semiconductor drive (SSD) includes a storage unit for storing data in a semiconductor memory. When the memory system 1000 is used as the semiconductor drive (SSD), the operation speed of the host connected to the memory system 1000 is considerably improved.

As another example, the memory system 1000 is provided as one of various elements of electronic devices such as computers, Ultra Mobile PCs (UMPCs), workstations, netbooks, Personal Digital Assistants (PDAs), portable computers, web tablets, wireless phones, mobile phones, smart phones, e-books, Portable Multimedia Players (PMPs), portable game machines, navigation devices, black boxes, digital cameras, Digital Multimedia Broadcasting (DMB) players, digital audio recorders, digital audio players, digital picture recorders, digital picture players, digital video recorders, digital video players, devices for transmitting/receiving information at a wireless environment, one of various electronic devices configuring a home network, one of various electronic devices configuring a computer network, one of various electronic devices configuring a telematics network, RFID devices and one of various elements configuring a computing system.

Exemplarily, the nonvolatile memory device 1100 or the memory system 1000 may be mounted as various types of packages. For example, the nonvolatile memory device 1100 or the memory system 1000 may be packaged in a package type such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP), thereby being mounted.

Figure 24:
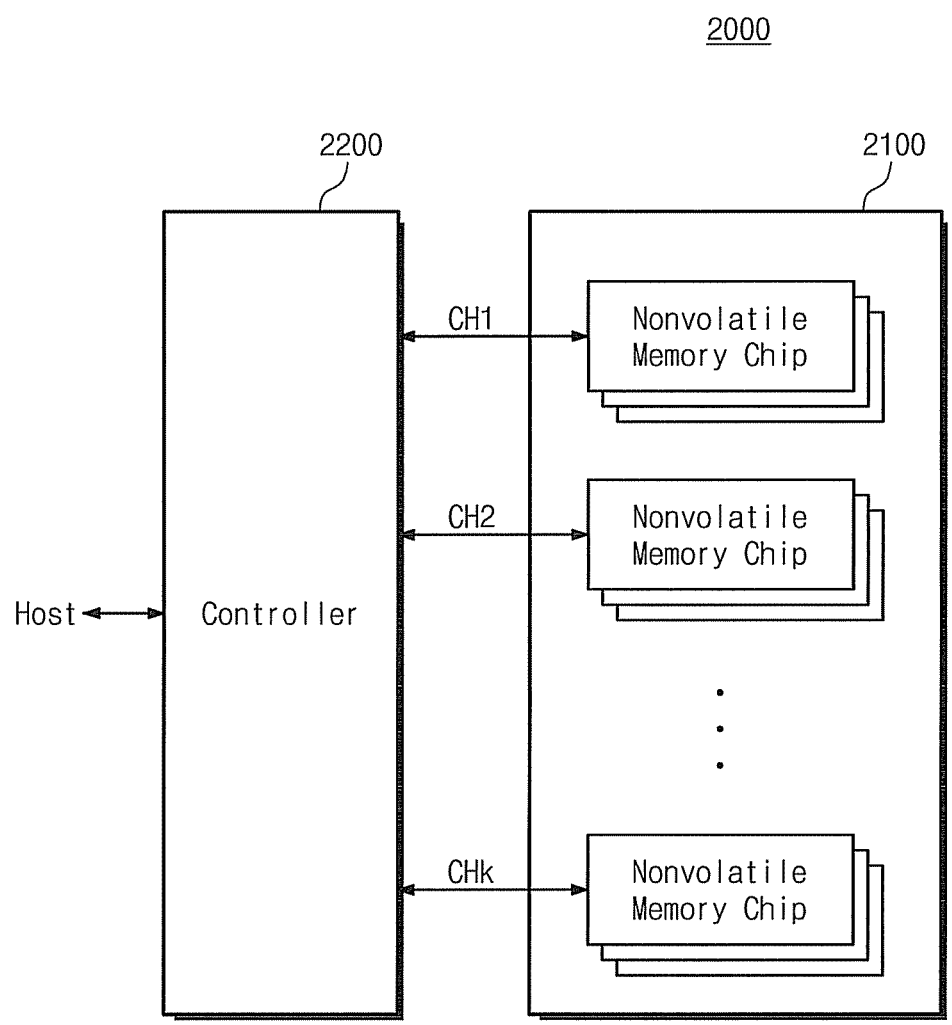
FIG. 24 is a block diagram illustrating an application example of the memory system 1000 of FIG. 1.

FIG. 24 is a block diagram illustrating an application example of the memory system 1000 of FIG. 23.

Referring to FIG. 24, a memory system 2000 includes a nonvolatile memory device 2100 and/or a controller 2200. The nonvolatile memory device 2100 includes a plurality of nonvolatile memory chips. The plurality of nonvolatile memory chips are divided by groups. Each group of the nonvolatile memory chips is configured to communicate with the controller 2200 through one common channel. In FIG. 24, it is illustrated that the plurality of nonvolatile memory chips communicate with the controller 2200 through first to kth channels CH1 to CHk. Each nonvolatile memory chip has same configuration as the nonvolatile memory device 100 described with reference to FIGS. 1 through 56.

Exemplarily, the controller 2200 is configured to control the nonvolatile memory device 2100. For example, the controller 2200 is configured o control a refresh operation of the nonvolatile memory device 2100. As described with reference to FIGS. 18 through 20, the controller 2200 controls a refresh operation of the nonvolatile memory device 2100.

The controller 2200 communicates with a plurality of nonvolatile memory chips through a plurality of channels. Accordingly, when a refresh operation is performed in one nonvolatile memory chip connected to a specific channel, nonvolatile memory chips connected to another channel continue in a standby state. That is, while a refresh operation is performed in one nonvolatile memory chip connected to one channel, operations such as writing, reading, and erasing may be performed in the nonvolatile memory chip connected to another channel.

Figure 25:
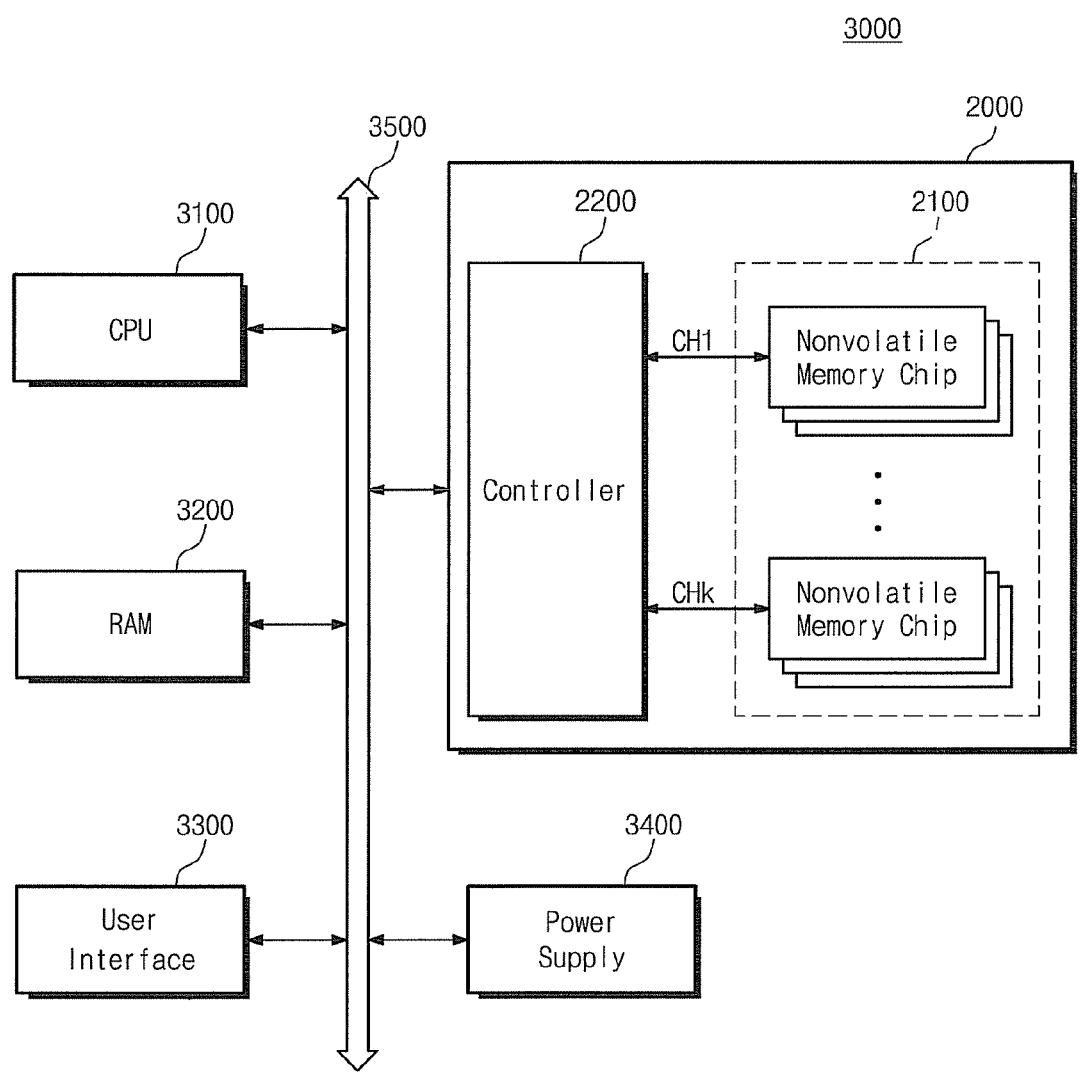
FIG. 25 is an example block diagram illustrating a computing system 300 with the memory system 2000 described with reference to FIG. 24.

FIG. 25 is a block diagram illustrating a computing system 3000 with the memory system 2000 described with reference to FIG. 24. Referring to FIG. 25, the computing system 3000 includes a central processing unit (CPU) 3100, a random access memory (RAM) 3200, a user interface 3300, a power 3400, a system bus 3500 and/or the memory system 2000.

The memory system 2000 is electrically connected to the CPU 3100, the RAM 3200, and the power 3400 through the system bus 3500. Data provided through a user interface 3300 or processed by the CPU 3100 are stored in the memory system 2000. The memory system 2000 includes a controller 2200 and a nonvolatile memory device 2100.

In FIG. 25, it is illustrated that the nonvolatile memory device 2100 is connected to the system bus 3500 through the controller 2200. However, the nonvolatile memory device 2100 may be directly connected to the system bus 3500. At this point, the CPU 3100 controls a refresh operation of the nonvolatile memory device 2100.

In FIG. 25, it is described that the memory system 200 described with FIG. 24 is provided. However, the memory system 2000 may be replaced with the memory system 1000 described with FIG. 23.

Exemplarily, the computing system 3000 may be configured to include all the memory systems 1000 and 2000 described with reference to FIGS. 1 and 24.

According to example embodiments of inventive concepts, erase disturbance by the activation of the ground selection transistor is prevented. Accordingly, the nonvolatile memory device, the erasing method thereof, and the memory system including the same may have improved reliability.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of inventive concepts are to be determined by the broadest permissible interpretation of the following claims and their equivalents, and shall not be restricted or limited by the foregoing detailed description.

What is claimed is:

1. An erasing method of a nonvolatile memory device having a memory string including a plurality of memory cells, a string selection transistor, and a ground selection transistor, the erasing method comprising:
   applying a word line erase voltage to a plurality of word lines connected to the memory cells respectively;
   applying a specific voltage to a ground selection line connected to the ground selection transistor;
   applying an erase voltage to a substrate in which the memory string formed during the step applying the specific voltage to the ground selection line; and
   floating the ground selection line in response to a voltage change of the substrate.

2. The erasing method of claim 1, wherein the applying of a specific voltage comprises applying a ground voltage to the ground selection line.

3. The erasing method of claim 1, wherein the floating of the ground selection line is performed when the voltage level of the substrate reaches a target voltage level.

4. The erasing method of claim 1, wherein the memory cells are stacked in a direction vertical to the substrate.

5. A nonvolatile memory device comprising:
   a memory cell array comprising a plurality of memory cell strings which are provided onto a substrate;
   a reading and writing circuit connected to the memory cell strings through a plurality of bit lines, and configured to drive the bit lines;

an address decoder connected to the memory cell strings through a plurality of word lines, a string selection line and a ground selection line, and configured to drive the word lines and the selection lines; and a substrate monitor circuit monitoring a voltage level of the substrate wherein the address decoder drives the ground selection line according to a monitored result in an erasing operation.

6. The nonvolatile memory device of claim 5, wherein when an erasing voltage for the erase operation is started to be applied to the substrate, the address decoder is configured to drive the ground selection line to a ground voltage.

7. The nonvolatile memory device of claim 6, wherein during the erasing operation, the address decoder is configured to float the ground selection line when a voltage level of the substrate reaches a target voltage level.

8. The nonvolatile memory device of claim 5, wherein the substrate monitor circuit comprises:
first and second trimmers connected between a ground node and a substrate node to which a voltage of the substrate is provided; and
a comparator configured to compare a target voltage and a voltage of a node between the first and second trimmers to output the monitored result.

9. An erasing method of nonvolatile memory device, the method comprising:
providing the nonvolatile memory device including a memory string perpendicular to a substrate of a first conductivity, the memory string including a string select transistor, a plurality of memory cells and a ground select transistor using a pillar active body of the first conductivity contacting the substrate;
applying a word line erase voltage to a plurality of word lines connected to the plurality of memory cells;
applying a voltage to a ground selection line connected to the ground select transistor;
applying an erase voltage to the substrate; and
floating the ground selection line in response to a voltage shift of the substrate.

10. A nonvolatile memory device, comprising:
a substrate;
a memory string including a string select transistor, a plurality of memory cells and a ground select transistor using a pillar active body of a first conductivity contacting the substrate;
an address decoder configured to apply a word line erase voltage to a plurality of word lines connected to the plurality of memory cells and apply a voltage to a ground selection line connected to the ground select transistor;
a substrate bias circuit configured to apply an erase voltage to the substrate; and
a substrate monitor circuit configured to sense a voltage shift of the substrate, wherein the address decoder floats the ground selection line in response to the voltage shift of the substrate.

11. An erasing method of a nonvolatile memory device including a substrate and a plurality of memory blocks, each including a plurality of memory strings in a two-dimensional array, each including a string selection transistor, a plurality of memory cells, and a ground selection transistor, the plurality of memory strings arranged in rows and columns, wherein columns of the plurality of memory strings are each connected to a corresponding bit line by the corresponding string selection transistor and rows of the plurality of memory strings are each connected to a corresponding string select line by the corresponding string selection transistor, the method comprising;

selecting one of the plurality of memory blocks for erasing;
applying a word line erase voltage to a plurality of word lines connected to the plurality of memory cells of the selected memory block;
applying a voltage to a ground selection line connected to the ground select transistor of the selected memory block and not to at least one unselected memory blocks;
applying an erase voltage to the substrate; and
floating the ground selection line of the selected memory block in response to a voltage shift of the substrate.

12. The erasing method of claim 11, wherein the ground selection lines connected to the ground select transistors of the at least one unselected memory blocks are allowed to float.

13. The method of claim 11, wherein the voltage applied to the ground selection line connected to the ground select transistor of the selected memory block is a ground voltage.

14. The method of claim 11, wherein the voltage applied to the ground selection line connected to the ground select transistor of the selected memory block is allowed to float after the erase voltage reaches a threshold voltage.

15. The method of claim 11, further comprising:
monitoring a voltage of the substrate and when the voltage of the substrate reaches a threshold voltage, ceasing to apply the voltage to the ground selection line connected to the ground select transistor of the selected memory block.

16. The method of claim 11, further comprising:
floating the string selection lines connected to the string selection transistors for each of the plurality of memory blocks.

17. A nonvolatile memory device, comprising:
a substrate;
a plurality of memory blocks, each including a plurality of memory strings in a two-dimensional array, each string including a string selection transistor, a plurality of memory cells, and a ground selection transistor, the plurality of memory strings arranged in rows and columns, wherein columns of the plurality of memory strings are each connected to a corresponding bit line by the corresponding string selection transistor and rows of the plurality of memory strings are each connected to a corresponding string select line by the corresponding string selection transistor;
an address decoder configured to select one of the plurality of memory blocks for erasing, apply a word line erase voltage to a plurality of word lines connected to the plurality of memory cells of the selected memory block, apply a voltage to a ground selection line connected to the ground select transistor of the selected memory block and not to the unselected memory blocks;
a substrate bias circuit configured to apply an erase voltage to the substrate; and
a substrate monitor circuit configured to sense a voltage shift of the substrate, wherein the address decoder float the ground selection line in response to the voltage shift of the substrate.

18. The nonvolatile memory device of claim 17, wherein the address decoder allows the ground selection lines connected to the ground select transistors of the unselected memory blocks to float.

19. The nonvolatile memory device of claim 17, wherein the address decoder applies a ground voltage to the ground selection line connected to the ground select transistor of the selected memory block.

20. The nonvolatile memory device of claim 17, wherein the address decoder allows the voltage of the ground selection line connected to the ground select transistor of the selected memory block to float after the erase voltage reaches a threshold voltage.

21. The nonvolatile memory device of claim 17, wherein the substrate monitor circuit is adapted to monitor a voltage of the substrate and when the voltage of the substrate reaches a threshold voltage generate a ground enable signal, the address decoder ceasing to apply the voltage to the ground selection line connected to the ground select transistor of the selected memory block, in response to the ground enable signal and then floating the ground selection line.

22. The nonvolatile memory device of claim 21, the substrate monitor circuit further including,
first and second trimmers connected between a ground node and a substrate node to which the erase voltage of the substrate is provided; and
a comparator configured to compare a target voltage and a voltage of a node between the first and second trimmers and output a comparison result to the address decoder.

23. The nonvolatile memory device of claim 22, wherein if the comparison result indicates the voltage of the substrate has reached the threshold voltage, the address decoder stops applying the voltage to a ground selection line connected to the ground select transistor of the selected memory block.

24. The nonvolatile memory device of claim 17, the address decoder further floating the string selection line for each of the plurality of memory blocks.

25. The nonvolatile memory device of claim 21, the address decoder further including
at least two block word line drivers, each configured to generate a block selection signal,
a string selection line driver, configured to drive a string selection line of the plurality of memory blocks in response to the block selection signal,
a word line driver, configured to drive word lines of the plurality of memory blocks in response to the block selection signal,
a ground selection line driver, configured to drive a ground select line of one of the plurality of memory blocks and to receive the ground enable signal from the substrate monitor circuit and
a pass circuit, configured to transfer voltages driven by the string selection line driver, the word line driver, and the ground selection line driver to the corresponding lines of the selected one of the plurality of memory blocks in response to the block selection signal.

26. The nonvolatile memory device of claim 25, wherein the pass circuit includes a plurality of transistors, one to control each of the word lines, each of the string select lines, and each of the ground selection lines.

27. A nonvolatile memory device comprising:
a memory cell array comprising a plurality of memory cell strings which are provided onto a substrate;
a reading and writing circuit connected to the memory cell strings through a plurality of bit lines, and configured to drive the bit lines; and
an address decoder connected to the memory cell strings through a plurality of word lines, a string selection line and a ground selection line, and configured to drive the word lines and the selection lines; wherein the address decoder drives the ground selection line in an erasing operation by waiting a delay time after applying a voltage to the substrate.

28. The nonvolatile memory device of claim 27, wherein when an erasing voltage for the erase operation is started to be applied to the substrate, the address decoder is configured to drive the ground selection line to a ground voltage.

29. The nonvolatile memory device of claim 27, wherein during the erasing operation, the address decoder is configured to float the ground selection line when a voltage level of the substrate reaches a target voltage level.

30. A nonvolatile memory device, comprising:
a substrate;
a memory string including a string select transistor, a plurality of memory cells and a ground select transistor using a pillar active body of a first conductivity contacting the substrate;
an address decoder configured to apply a word line erase voltage to a plurality of word lines connected to the plurality of memory cells and apply a voltage to a ground selection line connected to the ground select transistor;
a substrate bias circuit configured to apply an erase voltage to the substrate; and
wherein the address decoder waits a delay time and then floats the ground selection line in response to the voltage shift of the substrate.

31. A nonvolatile memory device, comprising:
a substrate;
a plurality of memory blocks, each including a plurality of memory strings in a two-dimensional array, each string including a string selection transistor, a plurality of memory cells, and a ground selection transistor, the plurality of memory strings arranged in rows and columns, wherein columns of the plurality of memory strings are each connected to a corresponding bit line by the corresponding string selection transistor and rows of the plurality of memory strings are each connected to a corresponding string select line by the corresponding string selection transistor;
an address decoder configured to select one of the plurality of memory blocks for erasing, apply a word line erase voltage to a plurality of word lines connected to the plurality of memory cells of the selected memory block, apply a voltage to a ground selection line connected to the ground select transistor of the selected memory block and not to the unselected memory blocks; and
a substrate bias circuit configured to apply an erase voltage to the substrate;
wherein the address decoder waits a delay time and then floats the ground selection line in response to the voltage shift of the substrate.

32. The nonvolatile memory device of claim 31, wherein the address decoder allows the ground selection lines connected to the ground select transistors of the unselected memory blocks to float.

33. The nonvolatile memory device of claim 31, wherein the address decoder applies a ground voltage to the ground selection line connected to the ground select transistor of the selected memory block.

34. The nonvolatile memory device of claim 31, wherein the address decoder allows the voltage of the ground selection line connected to the ground select transistor of the selected memory block to float after the erase voltage reaches a threshold voltage.

35. The nonvolatile memory device of claim 31, the address decoder further floating the string selection line for each of the plurality of memory blocks.

36. The nonvolatile memory device of claim 31, the address decoder further including
at least two block word line drivers, each configured to generate a block selection signal, a string selection line driver, configured to drive a string selection line of the plurality of memory blocks in response to the block selection signal, a word line driver, configured to drive word lines of the plurality of memory blocks in response to the block selection signal, a ground selection line driver, configured to drive a ground select line of one of the plurality of memory blocks and to receive a time delay signal and a pass circuit, configured to transfer voltages driven by the string selection line driver, the word line driver, and the ground selection line driver to the corresponding lines of the selected one of the plurality of memory blocks in response to the block selection signal.

37. The nonvolatile memory device of claim 36, wherein the pass circuit includes a plurality of transistors, one to control each of the word lines, each of the string select lines, and each of the ground selection lines.

* * * * *